(12) United States Patent
Subramanian et al.

(10) Patent No.: US 11,791,257 B2
(45) Date of Patent: Oct. 17, 2023

(54) DEVICE TERMINAL INTERCONNECT STRUCTURES

(71) Applicant: Intel Corporation, Santa Clara, CA (US)

(72) Inventors: Sairam Subramanian, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/562,925

(22) Filed: Dec. 27, 2021

(65) Prior Publication Data
US 2022/0122911 A1 Apr. 21, 2022

Related U.S. Application Data

(63) Continuation of application No. 15/940,531, filed on Mar. 29, 2018, now Pat. No. 11,227,829.

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76819* (2013.01); *H01L 21/76837* (2013.01);
(Continued)

(58) Field of Classification Search
CPC ... H01L 21/768–76898; H01L 23/522–53295; H01L 29/785–7856; H01L 2029/7857–7858
See application file for complete search history.

(56) References Cited

U.S. PATENT DOCUMENTS 6,448,591 B1 9/2002 Juengling
6,509,274 B1 1/2003 Guo et al.
(Continued)

FOREIGN PATENT DOCUMENTS

EP 3945556 2/2022
JP 2005012016 1/2005
WO 2001015220 3/2001

OTHER PUBLICATIONS

Notice of Allowance from U.S. Appl. No. 15/940,531 dated Aug. 5, 2021, 8 pgs.
(Continued)

*Primary Examiner* — Daniel P Shook
(74) *Attorney, Agent, or Firm* — Essential Patents Group, LLP

(57) ABSTRACT

Integrated circuit structures including device terminal interconnect pillar structures, and fabrication techniques to form such structures. Following embodiments herein, a small transistor terminal interconnect footprint may be achieved by patterning recesses in a gate interconnect material and/or a source or drain interconnect material. A dielectric deposited over the gate interconnect material and/or source or drain interconnect material may be planarized to expose portions of the gate interconnect material and/or drain interconnect material that were protected from the recess patterning. An upper level interconnect structure, such as a conductive line or via, may contact the exposed portion of the gate and/or source or drain interconnect material.

20 Claims, 18 Drawing Sheets

(51) Int. Cl.
  *H01L 27/088* (2006.01)
  *H01L 21/8234* (2006.01)
(52) U.S. Cl.
  CPC .............. *H01L 21/76885* (2013.01); *H01L 21/823475* (2013.01); *H01L 27/088* (2013.01)

(56) References Cited

U.S. PATENT DOCUMENTS

| | | |
|---|---|---|
| 6,972,985 B2 | 12/2005 | Rinerson et al. |
| 8,432,040 B2 | 4/2013 | Yu et al. |
| 8,848,424 B2 | 9/2014 | Ikeda et al. |
| 8,975,138 B2 | 3/2015 | Chandhok et al. |
| 10,825,515 B1 | 11/2020 | Kim |
| 11,239,156 B2 | 2/2022 | Karpov et al. |
| 11,444,024 B2 | 9/2022 | Lin et al. |
| 2001/0054769 A1 | 12/2001 | Raaijmakers et al. |
| 2002/0182855 A1* | 12/2002 | Agarwala ........... H01L 23/5283 257/E23.152 |
| 2005/0153544 A1 | 7/2005 | Suh et al. |
| 2005/0191846 A1 | 9/2005 | Cheung et al. |
| 2015/0056800 A1 | 2/2015 | Mebarki et al. |
| 2017/0372960 A1 | 12/2017 | Mebarki et al. |
| 2019/0304836 A1 | 10/2019 | Kikuchi et al. |
| 2019/0304902 A1 | 10/2019 | Subramanian et al. |
| 2020/0105592 A1 | 4/2020 | Kuo et al. |
| 2020/0168500 A1 | 5/2020 | Lazzarino et al. |
| 2021/0398996 A1 | 12/2021 | Parekh |
| 2022/0139772 A1 | 5/2022 | Jezewski et al. |
| 2022/0139823 A1 | 5/2022 | Lin et al. |

OTHER PUBLICATIONS

Notice of Allowance from U.S. Appl. No. 15/940,531 dated Sep. 16, 2021, 7 pgs.
Restriction Requirement from U.S. Appl. No. 15/940,531 dated May 4, 2021, 5 pgs.
Lin, Kevin L., et al., "Staggered Metallization with Air gaps for Independently Tuned Interconnect Resistance and Capacitance", 2020 IEEE, 4 pgs.
Merkx, Marc J. M., et al., "Area-Selective Atomic Layer Deposition of TiN Using Aromatic Inhibitor Molecules for Metal/Dielectric Selectivity", Chemistry of Materials, 2020, 8 pgs.

* cited by examiner

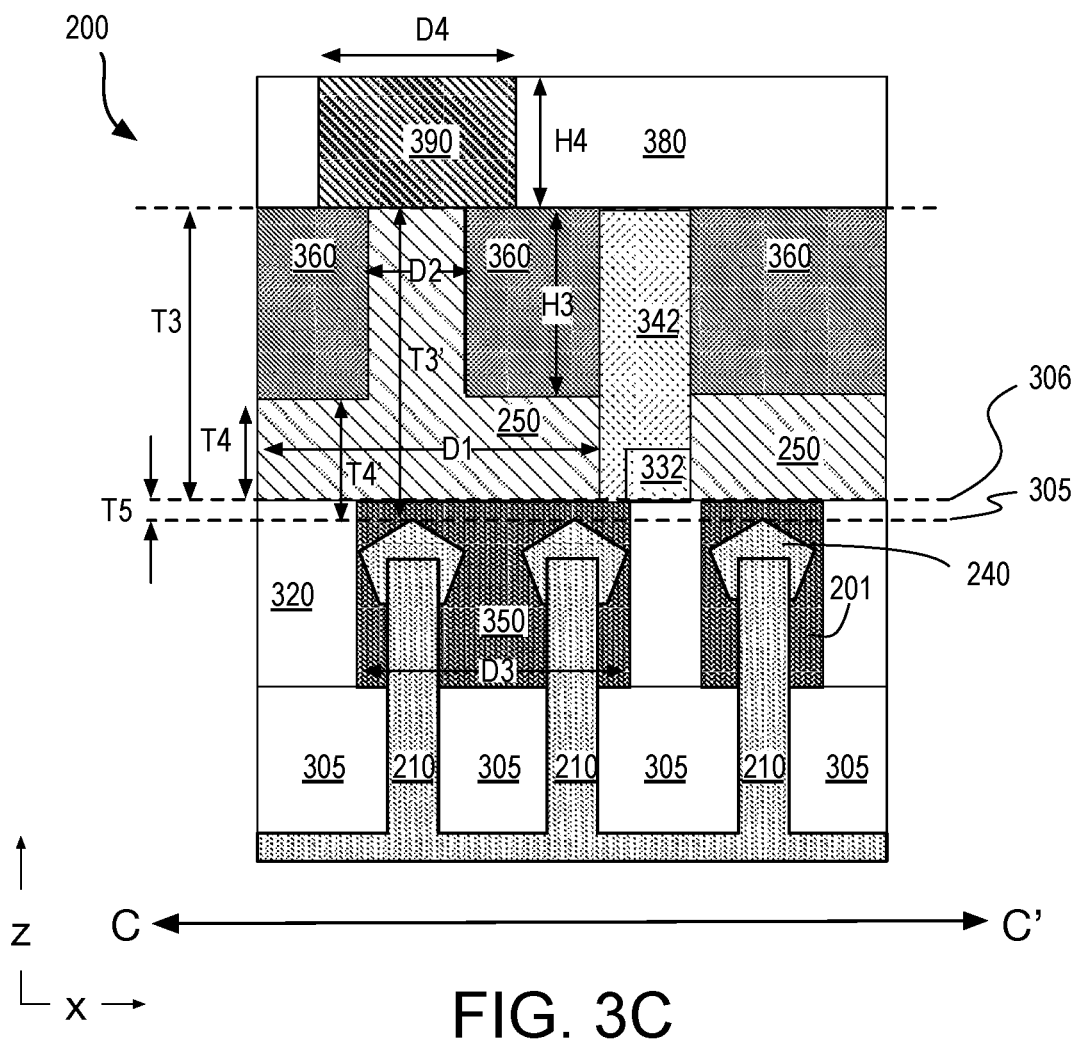
FIG. 3C
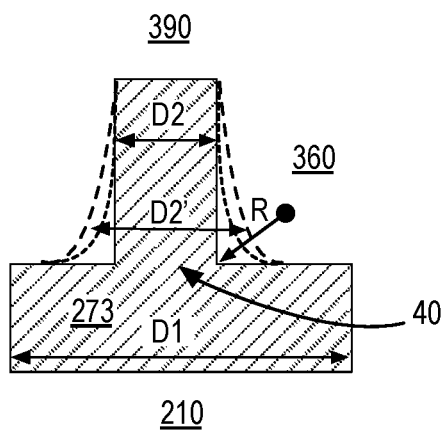
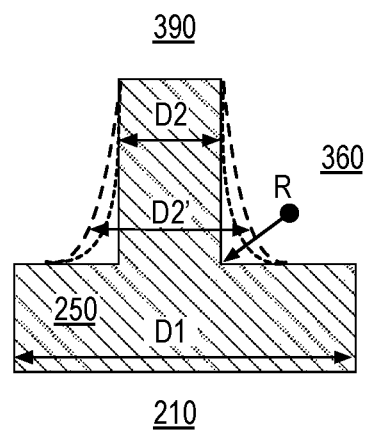
FIG. 4A    FIG. 4B

DEVICE TERMINAL INTERCONNECT STRUCTURES

CLAIM OF PRIORITY

This application is a Continuation of, and claims the benefit of priority to, U.S. patent application Ser. No. 15/940,531, filed on Mar. 29, 2018 and titled "DEVICE TERMINAL INTERCONNECT STRUCTURES," which is incorporated by reference in entirety.

BACKGROUND

Integrated circuits (ICs) may include passive devices, such as resistors, and active devices, such as metal-oxide-semiconductor field-effect transistors (MOSFETs), or the like. FIG. 1 illustrates a cross sectional view of a conventional device terminal interconnect. As shown, a device terminal 2 has a sidewall adjacent to a dielectric material 3. Device terminal 2 may be a transistor gate metal, a transistor source or drain contact metal, a resistor contact metal, or the like. A dielectric material 4 is over device terminal 2. Another dielectric material 5 is over dielectric material 4. An interconnect structure including a conductive via 6 and a conductive line 7 is to interconnect device terminal 2 to other nodes of an IC (not depicted). In the illustrated example, conductive via 6 has a lateral diameter D1 and conductive line 7 has a lateral diameter D2. Lateral diameter D1 may be minimized to avoid electrically shorting device terminal 2 to adjacent conductive features 1. Lateral diameter D2 may be larger than D1 for reduced interconnect resistance. With dimensions of integrated circuitry continuing to scale down from one technology generation to the next, it is desirable to also scale down the footprint of terminal interconnects within the IC. Hence, as lateral dimension D3 of device terminal 2 is scaled, lateral diameter D1 should also be scaled.

The device terminals within an IC are typically interconnected by first defining an opening, or via, in a dielectric, such as dielectric material 4. Because of the etch process employed to fabricate the opening, the opening will not typically have a vertical sidewall 11, but instead will have a tapered sidewall 12 or 13, for example. Although the degree of taper may vary, the bottom diameter of the opening is significantly smaller than diameter D1. Also, even if an etch process may occasionally achieve vertical sidewall 11, the bottom of the opening will have a positive radius of curvature from a point within conductive via 6. Once formed, the opening is then filled with one or more conductive materials (e.g., metals), to form conductive via 6. However, the patterning and filling of such openings becomes more challenging as lateral diameter D1 shrinks.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 3C is a cross-sectional view of the transistor structures illustrated in FIG. 2 through a length of source or drain interconnects as demarked by the C-C' line of FIG. 2, in accordance with some embodiments;

FIG. 4A is a cross-sectional view of a gate interconnect, in accordance with some embodiments;

FIG. 4B is a cross-sectional view of a source and/or drain interconnect, in accordance with some embodiments;

DETAILED DESCRIPTION

Figure 1:
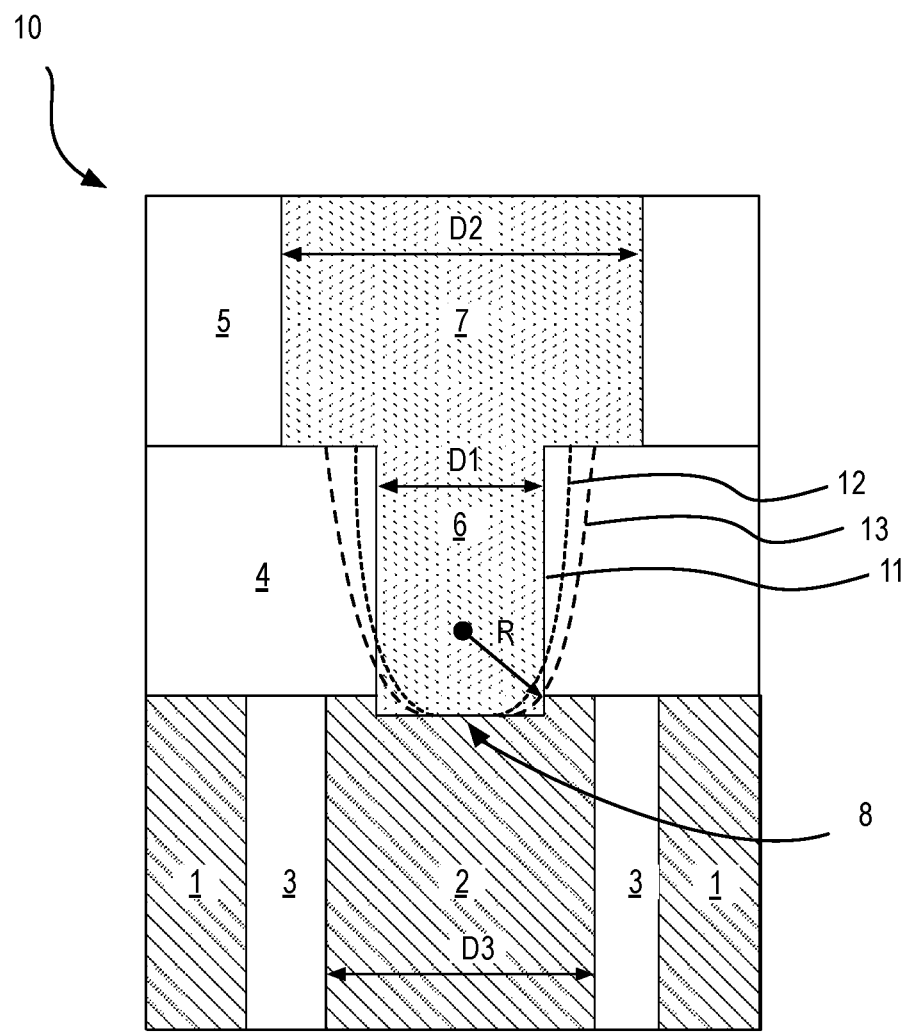
FIG. 1 is a cross-sectional view of a conventional device terminal interconnect.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other, without any intermediary materials or devices. "Coupled" may be used to indicated that two or more elements are in either direct or indirect (with other intervening elements between them) physical or electrical contact with each other, and/or that the two or more elements co-operate or interact with each other (e.g., as in a cause an effect relationship), through one or more passive or active intermediary materials or devices.

A "device" may generally refer to an apparatus according to the context of the usage of that term. For example, a device may refer to a stack of layers or structures, a single structure or layer, a connection of various structures having active and/or passive elements, etc. Generally a device is a three dimensional structure with a lateral x-y plane and a height along the z direction within an x-y-z Cartesian coordinate system. The plane of the device may also be the plane of an apparatus, which comprises the device.

The terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "adjacent" generally refers to a position of a thing being laterally (within an x-y plane) next to (e.g., immediately next to), or adjoining another thing (e.g., abutting it).

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Unless otherwise specified the use of the ordinal adjectives "first," "second," and "third," etc., to describe a common object, merely indicates that different instances of like objects are being referred to, and are not intended to imply that the objects so described must be in a given sequence, either temporally, spatially, in ranking or in any other manner.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of their use, the terms "substantially equal," "about equal" and "approximately equal" mean that there is no more than incidental variation between among things so described. In the art, such variation is typically no more than +/−10% of a predetermined target value. As used herein, the term "substantially" in the context of a composition means more than 90 at. %.

As used herein, a "channel region" is in reference to a structural region of a semiconductor body in which a transistor channel may form during operation of a FET. An active channel need not be present within a channel region. Hence, a channel region of a FET is present even when a FET is in an OFF state and no electrically active channel is present.

Described herein are integrated circuit structures including a device terminal interconnect structure that has a top surface comprising "pillar" or "ridge." Following principles conveyed in the context of various exemplary embodiments, a device terminal interconnect footprint may be formed by patterning one or more portion of a terminal interconnect structure into one or more pillars or ridges, which can be further contacted by an upper level interconnect. The terminal interconnect structure described herein may, for example, replace or supplement conventional terminal interconnect structures, such as a conductive via.

Figure 2:
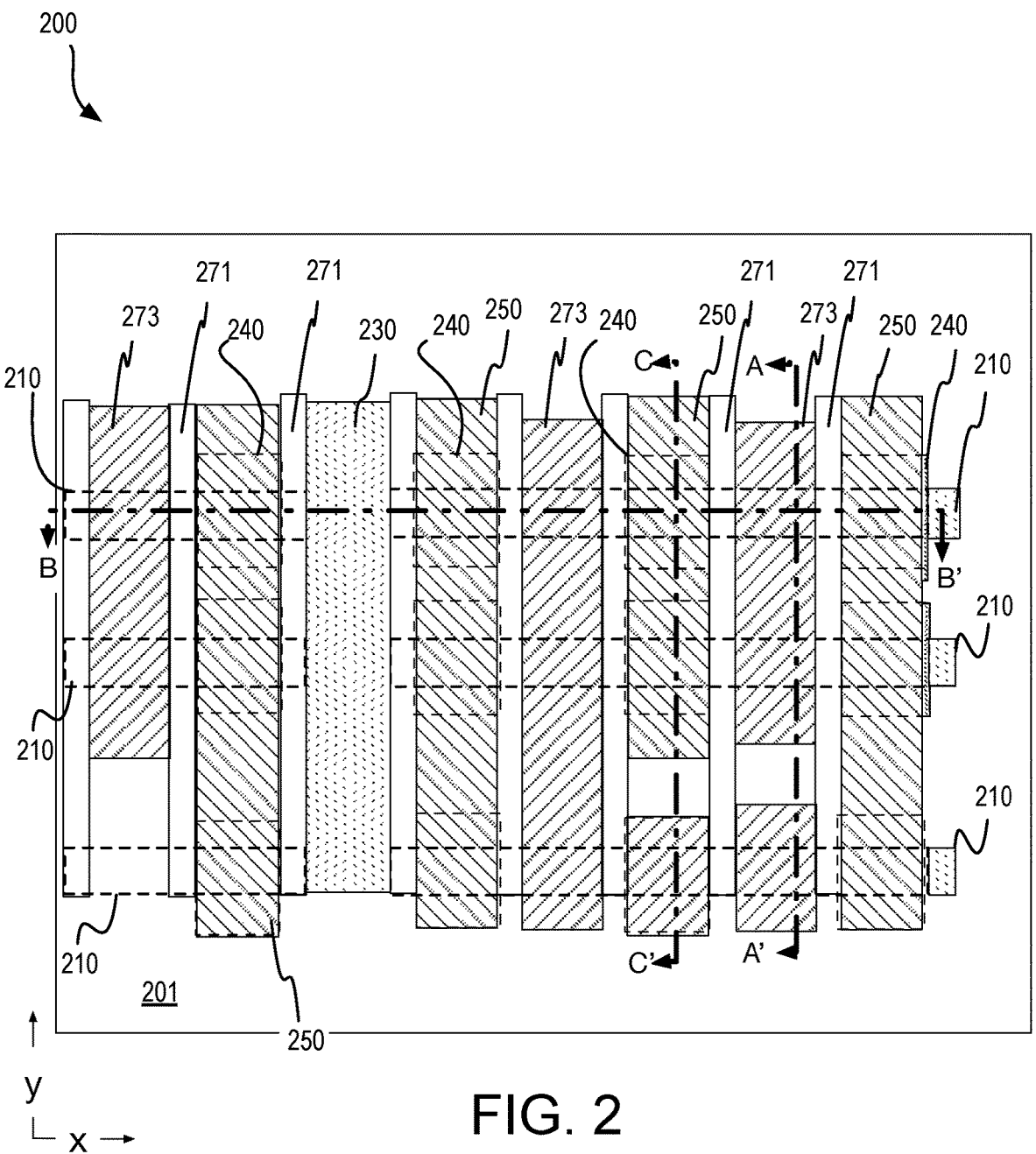
FIG. 2 is a plan view of transistor structures including one or more gate interconnect structures and/or source or drain interconnect structures, in accordance with some embodiments.

FIG. 2 is a plan view of transistor structures 200 including one or more gate terminal interconnect structures or source and/or drain terminal interconnect structures, in accordance with some embodiments. Transistor structures 200 include a plurality of transistor structures arrayed over an IC portion 201. Additional device structures may surround IC portion 201, for example, any of logic transistor structures, memory device structures, power transistor structures, RF transistor structures, optical device structures, or the like. Transistor structures 200 include a plurality of field effect transistors (FETs), each with a source terminal, a drain terminal, and a gate terminal. The gate terminal may include a gate dielectric such that the FETs are metal-oxide-semiconductor (MOS) FETs. In some embodiments, the source and drain terminals include semiconductor having the same conductivity type. In other embodiments, the source and drain terminals include semiconductor having complementary conductivity type (i.e., a tunnel FET, or TFET). The FETs may also include a heterojunction (i.e., HFET) and may also qualify as a high electron mobility transistor (HEMT) when the channel region comprises a III-V or III-N material. In some exemplary CMOS embodiments however, the channel region comprises a group IV material, such as Si, Ge, or a SiGe alloy. In FIG. 2, solid lines within transistor structures denote salient material structures that overly other material structures denoted in dashed lines. Heavy dot-dashed lines in FIG. 2 denote planes A-A', B-B' and C-C' along which cross-sectional views are further provided as FIG. 3A, 3B, 3C, respectively, where the letter suffix of the figure number corresponds to the cross-sectional plane designated in FIG. 2 by that same letter.

In further reference to FIG. 2, transistor structures 200 have a gate interconnect structure that includes an electrically conductive material 273 strapping across a channel region of one at least one of semiconductor bodies 210. Conductive material 273 may have any composition known to be suitable for a transistor gate electrode and or IC interconnect (e.g., having suitable electrical conductivity, adhesion, etc.). In some embodiments, conductive material 273 is predominantly a metal, metal alloy, or metallic compound. Conductive material 273 may be substantially homogenous, or have a layered (laminate) structure. As an example, conductive material 273 comprises one or more of tungsten, copper, titanium, platinum, ruthenium, tantalum, palladium, cobalt, nickel, tin, or aluminum. Conductive material 273 may also comprise a metallic compound, for example including one or more metals and nitrogen. Other alloy constituents may also be present in conductive material 273, such as, but not limited to carbon, hafnium, or zirconium.

Although three semiconductor bodies 210 are illustrated in FIG. 2, a non-planar FET may include one or more such semiconductor bodies. In some exemplary embodiments, semiconductor bodies 210 include at least one semiconductor material. That semiconductor material may have been derived from a starting substrate, or deposited as a thin film upon a starting substrate. For example, a transistor channel region within semiconductor bodies 210 may be derived from semiconductor device layer of a starting substrate. As such, semiconductor bodies 210 may include one or more semiconductor region having any composition known to be suitable for a transistor fabrication.

In some exemplary embodiments, semiconductor bodies 210 comprise predominantly one or more group IV (i.e., IUPAC group 14) semiconductor material layers (e.g., Si, Ge, SiGe), group III-V semiconductor material layers (e.g., GaAs, InGaAs, InAs, InP), or group III-N semiconductor material layers (e.g., GaN, AlGaN, InGaN). Semiconductor bodies 210 may also comprise predominantly one or more semiconductor transition metal dichalcogenide (TMD or TMDC) layers. In other embodiments, semiconductor bodies 210 comprise one or more graphene layer, or a graphenic material layer having semiconductor properties. In still other embodiments, semiconductor bodies 210 comprise one or more oxide semiconductor layers. Exemplary oxide semiconductor materials comprise predominantly oxygen and a transition metal (e.g., IUPAC group 4-10) or post-transition metal (e.g., IUPAC groups 11-14). In advantageous embodiments, the oxide semiconductor includes oxygen and at least one of Cu, Zn, Sn, Ti, Ni, Ga, In, Sr, Cr, Co, V, or Mo. These metal oxides may be suboxides ($A_2O$) monoxides (AO), binary oxides ($AO_2$), ternary oxides ($ABO_3$), and mixtures thereof. In some embodiments, at least the channel region of semiconductor bodies 210 is substantially monocrystalline Although monocrystalline, a significant number of crystalline defects may nonetheless be present. In other embodiments, at least the channel region of semiconductor bodies 210 is amorphous or nanocrystalline.

As further illustrated in FIG. 2, source or drain interconnect structures include an electrically conductive material 250 that is adjacent to, but separated from, conductive material 273. Conductive material 250 extends across source and drain regions of one or more semiconductor bodies 210. Conductive material 250 may be any material known to be suitable as an interconnect of transistor source and drain terminals. Conductive material 250 may have the same composition as conductive material 273, or may have a different composition than conductive material 273. For example, conductive material 250 may include one or more metals, such as, but not limited to, tungsten, cobalt, ruthenium, and titanium. Conductive material 250 may include at least one of a compound comprising titanium, a compound comprising tungsten, a compound comprising tantalum, or a compound comprising a group III material. Such compounds may further comprise nitrogen, for example, or may comprise more than one constituent metal.

In the illustrated embodiment, conductive material 250 is electrically coupled to regrown or "raised" source and drain semiconductor material 240, which is further coupled with the channel portion of semiconductor bodies 210. Source and drain semiconductor material 240 may be doped with electrically active impurities (e.g., phosphorus, boron or arsenic) imparting n-type (donor impurity) conductivity or p-type (hole impurity) conductivity. For some exemplary embodiments, both the source and drain semiconductor material 240 may have same conductivity type (e.g., n-type for NMOS and p-type for PMOS). In alternative embodiments (e.g., for a tunneling FET), source and drain semiconductor material 240 have complementary conductivity (e.g., n-type source and p-type drain). Source and drain semiconductor material 240 may be any semiconductor material compatible with semiconductor bodies 210, such as, but not limited to, group IV semiconductor materials (e.g., Si, Ge, SiGe), and/or group III-V semiconductor materials (e.g., InGaAs, InAs), and/or group III-N semiconductor materials (e.g., InGaN), and/or (metal) oxide semiconductor materials.

A dielectric material 271 laterally separates conductive material 273 from conductive material 250 and/or laterally separates conductive material 273 from source and drain semiconductor material 240. Dielectric material 271 may be any dielectric known to be suitable as a gate "spacer" such as, but not limited to, one or more of silicon dioxide (e.g., comprising predominantly silicon and oxygen), silicon nitride (e.g., comprising predominantly silicon and nitrogen), or silicon oxynitride (e.g., comprising predominantly silicon, oxygen, and nitrogen), or any known low-k material having a relative permittivity below 3.5, such as, but not limited to carbon-doped oxide (e.g., comprises predominantly silicon oxygen and carbon, and some hydrogen impurity). In the example shown in FIG. 2, two instances of conductive material 273 are coupled to a transistor gate, and three instances of conductive material 250 are coupled to a transistor source or drain on one side of an isolation dielectric material 230 that cuts through, or bifurcates, semiconductor bodies 210. On the other side of isolation dielectric material 230 is a portion of another transistor including another gate terminal that is coupled to conductive material 273, and another source or drain terminal that is coupled to conductive material 250. Isolation dielectric material 230 may be any dielectric material known to be suitable as a shallow trench isolation material, such as, but not limited to, one or more of silicon dioxide (e.g., comprising predominantly silicon and oxygen), silicon nitride (e.g., comprising predominantly silicon and nitrogen), or silicon oxynitride (e.g., comprising predominantly silicon, oxygen, and nitrogen), or any known low-k material having a relative permittivity below 3.5, such as, but not limited to carbon-doped oxide (e.g., comprises predominantly silicon oxygen and carbon, and some hydrogen impurity). In some embodiments, isolation dielectric material 230 is a different material that dielectric material 271.

Figure 3A:
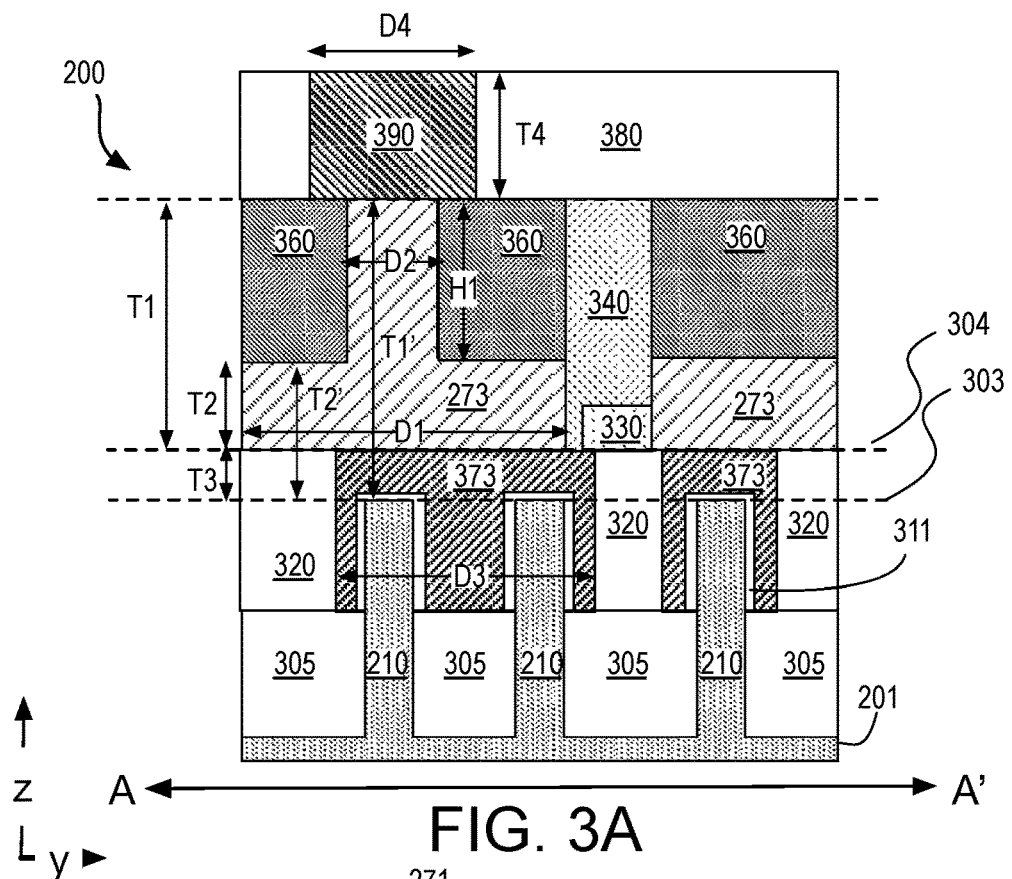
FIG. 3A is a cross-sectional view of the transistor structures illustrated in FIG. 2 along a longitudinal axis of a semiconductor body demarked by the A-A' line of FIG. 2, in accordance with some embodiments.

In accordance with some exemplary embodiments, at least one of a source or drain interconnect, or a gate interconnect has one or more pillars or ridges, which can be further contacted by an upper level interconnect. Such a pillar or ridge may be formed in one or more conductive materials that are electrically coupled to a particular device terminal. Generally, a pillar or ridge structure is to be within at least a top-most conductive material of a device terminal interconnect. FIG. 3A is a cross-sectional view of the transistor structures illustrated in FIG. 2 along the longitudinal axis of a semiconductor body demarked by the A-A' line of FIG. 2, in accordance with some embodiments. As shown, conductive material 273 includes a pillar or ridge having sidewall height H1 above an adjacent portion of conductive material 273. Hence, one portion of a conductive material 273 having a lateral dimension (e.g., diameter) D1 has a thickness T1 (along the z-axis), as measured from a top surface of an underlying conductive material 373. From a dashed reference line 304 that demarks an interface between conductive materials 273 and 373, one or more other portions of conductive material 273 only have a thickness T2. The difference between thicknesses T1 and T2 being substantially equal to pillar sidewall height H1.

As further illustrated in FIG. 3A, conductive material 273 is electrically coupled to at one or more semiconductor bodies 210 through another conductive material 373 and a gate dielectric material 311. Gate dielectric material 311 may have any composition and any thickness known to be suitable for transistors having a channel of a given semiconductor composition and operable under given bias conditions. In some embodiments, gate dielectric material 311 is a material having a conventional relative permittivity (e.g., k value below 9), such as, but not limited to silicon dioxide (e.g., comprising predominantly silicon and oxygen), silicon oxynitride (e.g., comprising predominantly silicon, oxygen, and nitrogen), or silicon nitride (e.g., comprising predominantly silicon and nitrogen). In some other embodiments, gate dielectric 211 is a material having a high relative permittivity (e.g., k value above 10). The high-k dielectric material may include elements such as hafnium, silicon, oxygen, titanium, tantalum, lanthanum, aluminum, zirconium, barium, strontium, yttrium, lead, scandium, niobium, and zinc. The high-k material in some embodiments is a metal oxide (e.g., comprising one or more of hafnium and oxygen, hafnium, silicon and oxygen, lanthanum and oxygen, lanthanum, aluminum and oxygen, zirconium and oxygen, zirconium, silicon and oxygen, tantalum and oxygen, titanium and oxygen, barium, strontium, titanium and oxygen, barium, titanium, and oxygen, strontium, titanium and oxygen, yttrium and oxygen, aluminum and oxygen, lead, scandium, tantalum and oxygen, and lead zinc niobate). The high-k material in some embodiments is a metal silicate (e.g., comprising one or more of above metals, oxygen and silicon). In still other embodiments, gate dielectric 211 includes two or more dielectric material layers, such as, but not limited to, a layer with a higher relative permittivity over a layer with a lower relative permittivity. The one or more layers may include a layer of silicon and oxygen (e.g., $SiO_2$) and a layer of a high-k dielectric material.

Conductive material 373 may have various functions in the context of a transistor, such as setting a work function of a transistor gate terminal and/or electrically interconnecting two or more semiconductor bodies 210. Conductive material 373 may therefore have any composition suitable for controlling the channel conductivity of a semiconductor channel Conductive material 373 may be predominantly an elemental metal, a metal alloy, or even a doped semiconductor material (e.g., polysilicon). In some embodiments, conductive material 373 of an N-type transistor has a different composition than conductive material 373 of a P-type transistor. Conductive material 373 may have a composition that varies between N-type and P-type transistors even where the composition of conductive material 273 is the same for both N-type and P-type transistors. Conductive material 373 may, for example, include at least one P-type work function metal or N-type work function metal, depending on conductivity type of the transistor channel (e.g., NMOS transistors with N-type work function metal and PMOS transistors with P-type work function metal). For some exemplary PMOS transistors, metals that may be used for conductive material 373 include, but are not limited to, ruthenium, palladium, platinum, cobalt, nickel, and conductive metal oxides (e.g., ruthenium oxide). For some exemplary NMOS transistors, conductive material 373 may include, but is not limited to, hafnium, zirconium, titanium, tantalum, aluminum, alloys of these metals, and carbides of these metals such as hafnium carbide, zirconium carbide, titanium carbide, tantalum carbide, and aluminum carbide.

As shown in FIG. 3A, a bottom surface of conductive material 373 substantially follows the topography of semiconductor bodies 210 and extends laterally beyond a sidewall of semiconductor bodies 210. A sidewall of conductive material 373 is adjacent to a dielectric material 305. Dielectric material 305 may be any dielectric suitable for electrically isolation, such as, but not limited to, any of those materials described above for dielectric material 230 or 271. The top surface of conductive material 373 is substantially planar (e.g.

substantially parallel to the y-axis or a plane of a substrate), or may have top topography that is at least partially filled with conductive material 273. Conductive material 373 has a nominal thickness T3 between the top of semiconductor bodies 201 and an interface 304 where conductive material 273 contacts conductive material 373. In the illustrated example, the gate interconnect may be considered to include both conductive materials 273 and 373 such that one portion of the gate interconnect, as measured from a dashed reference line 303 that intersects a top of a plurality of semiconductor bodies 210 (i.e., is substantially parallel the y-axis) has a greater thickness T1' than another portion that has a thickness of only T2'. The difference between thicknesses T1' and T2' is substantially equal to sidewall height H1.

As further shown in FIG. 3A, another dielectric material 340 is adjacent to a sidewall of conductive material 273. Dielectric materials 320 and 340 may be any dielectric material known to be suitable for electrically isolating conductive features of transistors, such as, but not limited to, any of the compositions described for dielectric materials 230, 271, or 305. In some embodiments, dielectric materials 320 and 340 have substantially the same composition. In other embodiments, dielectric materials 320 and 340 have different compositions. Dielectric material 320 is laterally between one feature of conductive material 373 and an adjacent feature of conductive material 373. Likewise, dielectric material 340 is laterally between one feature of conductive material 273 and an adjacent feature of conductive material 273. Together, dielectric materials 320 and 340 electrically isolate one gate interconnect from another, adjacent, gate interconnect. One or more other dielectric materials may also be present (e.g., dielectric material 330), as embodiments herein are not limited in this respect.

Notably, for embodiments where a gate interconnect includes multiple conductive materials (e.g., 273 and 373), the various conductive materials need not be exactly aligned to each other. For example, in FIG. 3A, conductive material 273 has a lateral dimension D1 that is both larger than lateral dimension D3 of conductive material 373 and laterally offset from conductive material 373 so that a portion of conductive material 273 is over dielectric material 320. With a gate interconnect having a pillar or ridge architecture as illustrated in FIG. 3, a sidewall of the portion of the conductive material 273 having the thickness T1 is adjacent to another dielectric material 360. Dielectric material 360 may be any dielectric material known to be suitable for electrically isolating conductive features of transistors, such as, but not limited to, any of the compositions suitable for dielectric materials 230, 271, 305, 320 or 340. Dielectric material 360 is laterally between a pillar of conductive material 273 and dielectric material 340. In some embodiments, dielectric material 360 has a different composition than dielectric material 340. In other embodiments, dielectric material 360 has substantially the same composition as dielectric material 340. In either situation, a material boundary may present between dielectric material 360 and dielectric material 340. As described further below, a boundary between dielectric materials 340 and 360 may be indicative of conductive material 273 having been recessed etched independent of a process employed to electrically separate two adjacent features of conductive material 273.

Notably, a gate interconnect need not have all the features illustrated in FIG. 3A. For example, a gate interconnect may comprise only one conductive material (e.g., conductive material 373), with a top surface of conductive material 373 then having a non-planar top surface (e.g., a pillar or ridge structure) substantially as illustrated for conductive material 273.

A top surface of the portion of conductive material 273 that has the greatest thickness or z-height is substantially planar with a top surface of dielectric material 360. As further illustrated in FIG. 3A, an upper level interconnect including a conductive material 390 is over conductive material 273 and over dielectric material 360. Conductive material 390 is coupled to conductive material 273, and a dielectric material 380 is adjacent to a sidewall of conductive material 390. In the illustrated example, conductive material 390 is in contact with a top surface of conductive material 273. With conductive material 273 including a pillar, an upper level interconnect need not include a conductive via to couple with a gate interconnect. For example, conductive material 390 may simply comprise a wire or line of lateral dimension D4 and thickness T4 that intersects conductive material 273. In other embodiments, an upper level interconnect may still include both a conductive via and a conductive wire, line or trace. Where conductive material 390 is a conductive via, for example, lateral dimension D4 and thickness T4 may define a via of lower aspect ratio than may otherwise be possible if conductive material 273 had a planar top surface.

Conductive material 390 may have any composition known to be suitable for an IC interconnect, such as, but not limited to, any of the compositions described for conductive material 273. In some embodiments, conductive material 390 has a different composition than conductive material 273. For example, conductive material 390 may be predominantly Cu while conductive material 273 is predominantly other than Cu (e.g., predominantly Ru, Co, etc.). As another example, conductive material 390 may include one or more barrier or adhesion materials (e.g. comprising predominantly Ta and/or N), and one or more fill and/or cap layers (e.g., comprising predominantly Cu, Co, or Ru) while conductive material 273 is substantially homogenous (e.g., lacking a barrier/fill and/or cap structure). In other embodiments, conductive material 390 has the same composition as conductive material 273. For example conductive materials 273 and 390 may both comprise predominantly Ru. As another example, both conductive material 390 and conductive material 273 may include one or more barrier or adhesion materials (e.g. comprising Ta and/or N), and one or more fill and/or cap layers (e.g., comprising predominantly Ru).

Figure 3B:
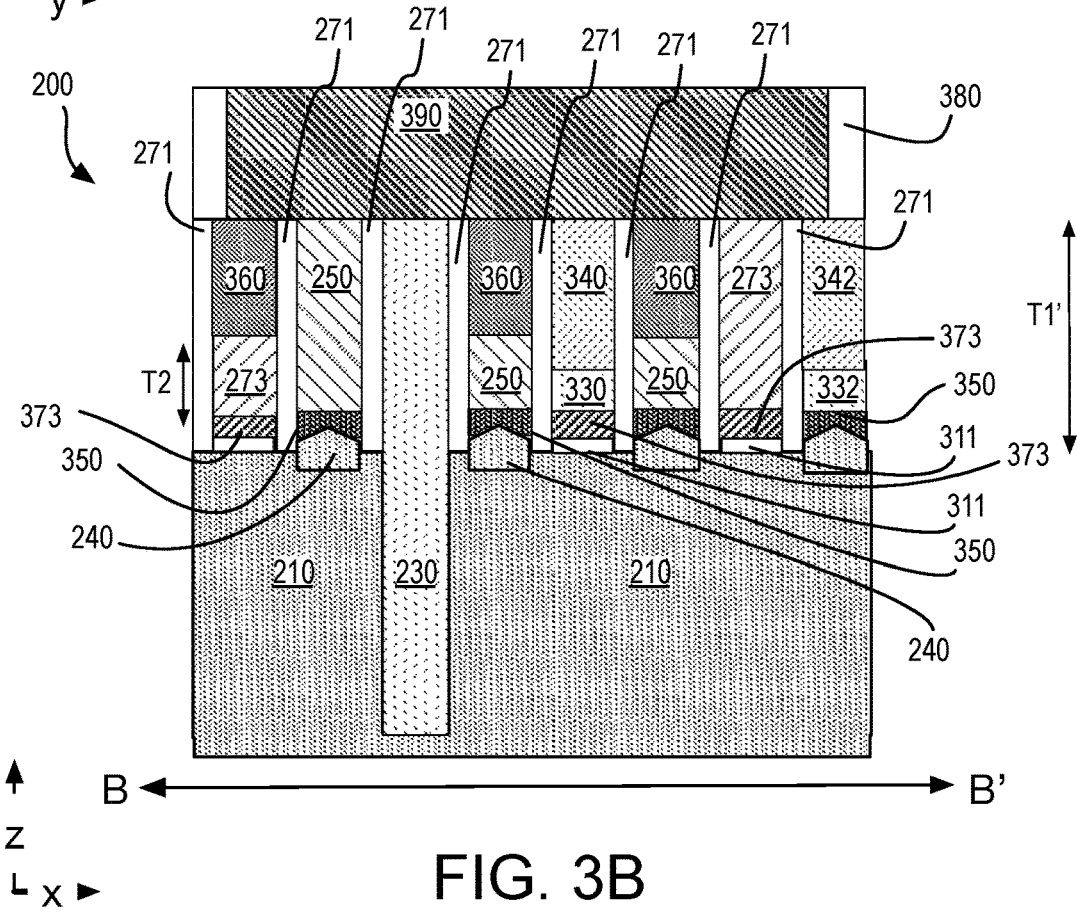
FIG. 3B is a cross-sectional view of the transistor structures illustrated in FIG. 2 through a length of gate interconnects as demarked by the B-B' line of FIG. 2, in accordance with some embodiments.

FIG. 3B is a cross-sectional view of the transistor structures illustrated in FIG. 2 through a length of gate interconnects as demarked by the B-B' line of FIG. 2, in accordance with some embodiments. As shown in FIG. 3B, the B-B' line extends along a longitudinal length of multiple semiconductor bodies 210 aligned end-to-end with their ends separated by isolation dielectric material 230. For one gate interconnect that has the pillar portion in a plane of the section illustrated in FIG. 3B, conductive material 273 and conductive material 373 is stacked over a top of semiconductor bodies 210 with conductive material 273 in contact with conductive material 390 of an upper level interconnect. For another gate interconnect where the pillar portion is out of the plane of FIG. 3B, dielectric material (e.g., dielectric materials 340 and 330) provides electrical isolation between conductive material 373 and conductive material 390. As further illustrated in FIG. 3B, for still another gate interconnect where the pillar portion is out of the plane of FIG. 3B, another dielectric material (e.g., dielectric material 360) is between conductive material 273 (e.g., a portion having thickness T2) and conductive material 390.

As further shown in FIG. 3B, dielectric material 271 is adjacent to a sidewall of both conductive materials 373 and 273. Even where a gate interconnect has a full thickness of T1', dielectric material 271 is adjacent to a sidewall of both conductive materials 373 and 273. Notably, in other portions of a gate interconnect that have a lesser thickness (e.g., T2') dielectric material 271 is adjacent to a sidewall of dielectric material 360. Dielectric material 271 has sufficient height (e.g., z-dimension) to be adjacent to a sidewall of pillar portions of a gate interconnect, and dielectric material 271 is also adjacent to a sidewall of dielectric material 360 that caps recessed portions of a gate interconnect. As such, dielectric material 271 separates dielectric material 340 from dielectric material 360 that is over conductive material 250 of an adjacent source or drain interconnect. The greater height of dielectric material 271 relative to some portions of a gate interconnect may also be indicative of a patterned recess etching of conductive material 273 performed selectively relative to dielectric material 271.

As noted above, source or drain interconnects may also have an architecture similar to that described above for gate interconnects. More specifically, a source or drain interconnect (or both a source interconnect and a drain interconnect) of a transistor may also have a pillar or ridge structure such that a portion of the source or drain interconnect may have a greater thickness and/or sidewall height than another portion of the source or drain interconnect. FIG. 3B further illustrates how many of the same structural features described above in the context of a gate interconnect are also applicable to a source or drain interconnect. For example, where a source or drain interconnect has a pillar portion in a plane of the section illustrated in FIG. 3B, conductive material 250 and an underlying conductive material 350 is stacked over a top of semiconductor bodies 210. Conductive material 250 is further in contact with conductive material 390 of an upper level interconnect feature. For another source or drain interconnect where the pillar portion is out of the plane of FIG. 3B, dielectric material (e.g., dielectric materials 342 and 332) is between conductive material 350 and conductive material 390. For still another source or drain interconnect where the pillar portion is out of the plane of FIG. 3B, another dielectric material (e.g., dielectric material 360) is between conductive material 250 and conductive material 390. Dielectric material 271 is therefore between conductive material 250 and conductive material 273, and is also between conductive material 350 and conductive material 373. As noted above, because dielectric material 271 may have a height substantially equal to the thickest portion of a gate interconnect, dielectric material 271 is also present between dielectric materials 340 and 360 where conductive materials 250 and 273 both have reduced thickness. In locations where conductive material 250 is absent, dielectric material 271 is also adjacent to dielectric materials 342 and 332.

FIG. 3C is a cross-sectional view of the transistor structures 200 through a length of source and/or drain interconnects as demarked by the C-C' line of FIG. 2, in accordance with some embodiments. As shown in FIG. 3C, a source or drain interconnect structure may have substantially the same architecture described above for a gate interconnect in the context of FIG. 3A. In FIG. 3C, conductive material 250 includes a pillar or ridge having sidewall height H3 above an adjacent portion of conductive material 250. Hence, one portion of a conductive material 250 having a lateral dimension (e.g., diameter) D2 has a thickness T3 (along the z-axis), as measured from a top surface of an underlying conductive material 350. From a dashed reference line 306 that demarks an interface between conductive materials 250 and 350, one or more other portions of conductive material 350 only have a thickness T4 with the difference between thicknesses T3 and T4 being substantially equal to sidewall height H3.

As further illustrated in FIG. 3C, conductive material 250 is coupled to at least a sidewall of one or more semiconductor bodies 210 through a conductive material 350 that, in this example, is directly contacting source or drain semiconductor material 240. Conductive material 350 may have various functions in the context of a transistor, such as a metal-semiconductor contact junction (e.g., ohmic or Schottky) and/or electrically interconnecting two or more source and/or drain regions of semiconductor bodies 210. Conductive material 350 may therefore have any composition suitable for contacting a semiconductor of a particular conductivity type. Conductive material 350 may be predominantly an elemental metal or a metal alloy. In some embodiments, conductive material 350 of an N-type transistor has a different composition than conductive material 350 of a P-type transistor. Conductive material 350 may have a composition that varies between N-type and P-type transistors even where the composition of conductive material 250 is the same for both an N-type and a P-type transistors. For some exemplary transistors, metals that may be used for conductive material 350 include, but are not limited to, Ti, Al, and Ni. In addition to comprising one or more metals, conductive material 350 may further comprise one or more of nitrogen, or carbon.

As shown in FIG. 3C, a bottom surface of conductive material 350 substantially follows the topography of semiconductor bodies 210 and extends laterally beyond a sidewall of semiconductor bodies 210. A top surface of conductive material 350 may be substantially planar (e.g. substantially parallel to the y-axis or a plane of a substrate), or may have top topography that is at least partially filled with conductive material 250. Conductive material 350 has a nominal thickness T5 between the top of source or drain semiconductor material 240, and an interface 306 where conductive material 250 contacts conductive material 350. In the illustrated example, the source or drain interconnect may be considered to include both conductive materials 250 and 350 such that one portion of the source or drain interconnect, as measured from a dashed reference line 305 that intersects a top of a plurality of source or drain semiconductor material 240 (i.e., is substantially parallel the y-axis) has a greater thickness T3' than another portion that has a thickness of only T4' with the difference between thicknesses T3' and T4' being substantially equal to sidewall height H3.

As further shown in FIG. 3C, dielectric material 320 is adjacent to a sidewall of conductive material 350 while dielectric material 342 is adjacent to a sidewall of conductive material 250. Dielectric material 342 may again be any dielectric material known to be suitable for electrically isolated conductive features of transistors, such as, but not limited to, any of the compositions described for dielectric materials 230, 271, 305, 340, or 360. In some embodiments, dielectric materials 320 and 342 have substantially the same composition. In other embodiments, dielectric materials 320 and 342 have different compositions. Dielectric material 320 is laterally between one feature of conductive material 350 and an adjacent feature of conductive material 350. Likewise, dielectric material 342 is laterally between one feature of conductive material 250 and an adjacent feature of conductive material 250. Together, dielectric materials 320 and 342 electrically isolate one source or drain interconnect from another, adjacent, source or drain interconnect. One or more other dielectric materials may also be present (e.g., dielectric material 332), as embodiments herein are not limited in this respect.

Notably, for embodiments where a source or drain interconnect includes multiple conductive materials (e.g., 250 and 350), the various conductive materials need not be exactly aligned to each other. For example, in FIG. 3C, conductive material 250 has a lateral dimension D1 that is both larger than lateral dimension D3 of conductive material 350, and conductive material 250 is laterally offset from conductive material 350 so that a portion of conductive material 250 is over dielectric material 305. With a source or drain interconnect having a pillar or ridge architecture as illustrated in FIG. 3C, a sidewall of the portion of the conductive material 250 having the thickness T3 is adjacent to dielectric material 360. Dielectric material 360 is laterally between a pillar of conductive material 250 and dielectric material 342. In some embodiments, dielectric material 360 has a different composition than dielectric material 342. In other embodiments, dielectric material 360 has substantially the same composition as dielectric material 342. In either situation, a material boundary may present between dielectric material 360 and dielectric material 342. As described further below, a boundary between dielectric materials 342 and 360 may be indicative of conductive material 250 having been recessed etched independent of a process employed to electrically separate two adjacent features of conductive material 250. Notably, a source or drain interconnect need not have all the features illustrated in FIG. 3C. For example, a source or drain interconnect may comprise only one conductive material (e.g., conductive material 350), with a top surface of conductive material 350 then having a non-planar top surface (e.g., a pillar or ridge structure) substantially as illustrated for conductive material 250.

A top surface of the portion of conductive material 250 that has the greatest thickness or z-height is substantially planar with a top surface of dielectric material 360. As further illustrated in FIG. 3C, an upper level interconnect including conductive material 390 is over conductive material 250 (e.g., in contact with a top surface of conductive material 250). In some embodiments, conductive material 390 has a different composition than conductive material 250. For some exemplary embodiments where conductive material 390 is predominantly Cu, conductive material 250 is predominantly other than Cu (e.g., predominantly Ru, Co, etc.). As another example, for some embodiments where conductive material 390 includes one or more barrier or adhesion materials (e.g. comprising predominantly Ta and/or N), and one or more fill and/or cap layers (e.g., comprising predominantly Cu, Co or Ru), conductive material 250 is substantially homogenous (e.g., lacking a barrier/fill and/or cap structure). In still other embodiments, conductive material 250 has substantially the same composition as conductive material 390. For example conductive materials 250 and 390 may both comprise predominantly Ru. As another example, conductive material 390 and conductive material 250 may both include one or more barrier or adhesion materials (e.g. comprising Ta and/or N), and one or more fill and/or cap layers (e.g., comprising predominantly Ru).

FIG. 4A is a cross-sectional view of a gate interconnect, in accordance with some embodiments. FIG. 4B is a cross-sectional view of a source or drain interconnect, in accordance with some embodiments. As shown in FIG. 4A, a gate interconnect may have a portion with a sidewall that is sloped such that a first lateral width D2 proximal to upper level interconnect 390 is smaller than a second lateral width D2' proximal to semiconductor body 210. Such a slope is substantially the opposite of what is expected of a conductive via taper (e.g., FIG. 1) and is therefore indicative of a patterned recess etching of conductive material 273. Even where a sidewall of the pillar portion of conductive material 273 is substantially vertical, the presence of a rounded corner may still be indicative of a recess etch. For example, as shown in FIG. 4A, the sidewall of conductive material 250 has a positive radius of curvature R about a point located within adjacent dielectric material 360. FIG. 4B illustrates substantially the same slope and rounded corner in the context of conductive material 250. These features are likewise indicative of a patterned recess etching of conductive material 250 during the formation of a source or drain interconnect.

Figure 5:
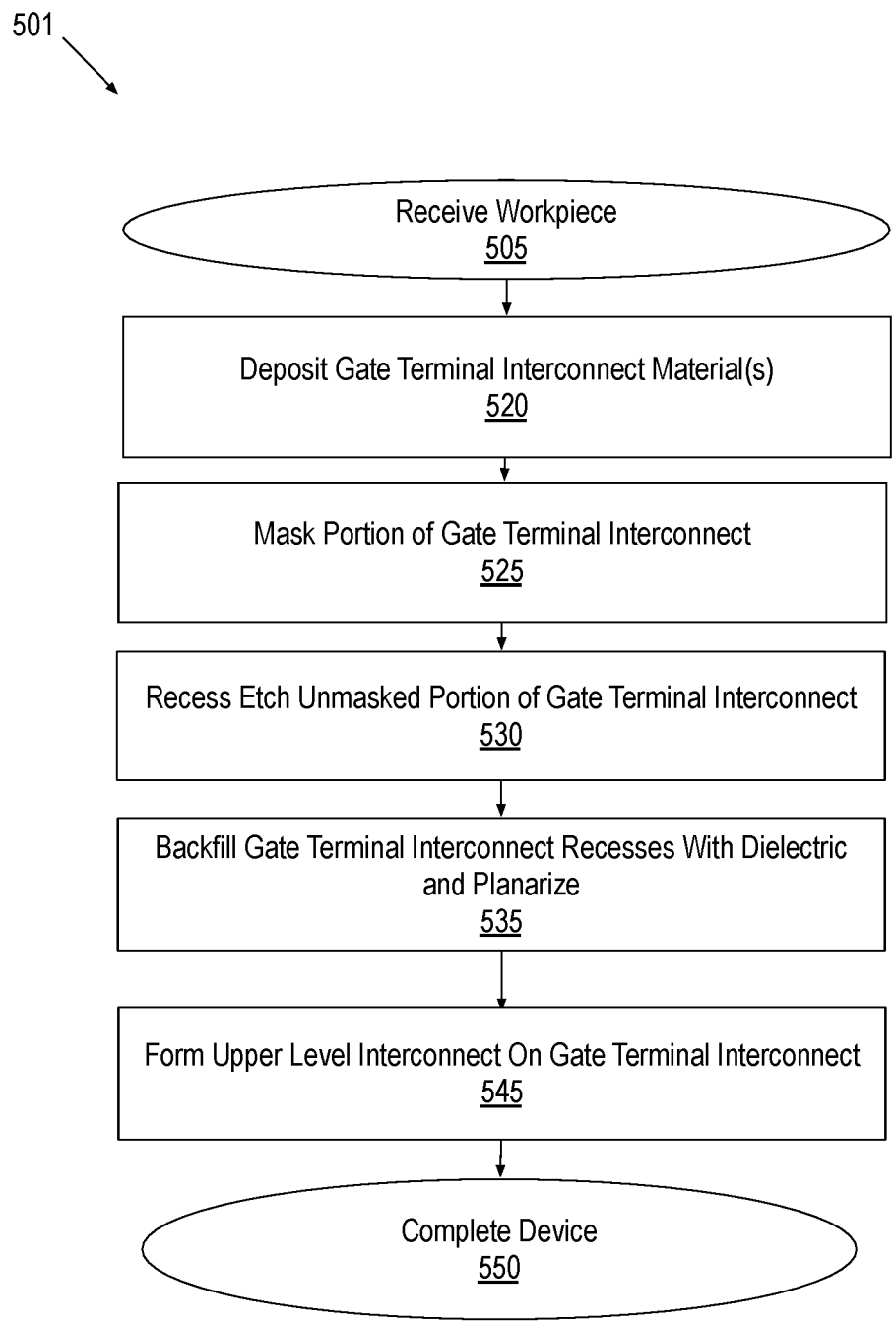
FIG. 5 is a flow diagram illustrating methods of forming gate interconnects, in accordance with some embodiments.

Terminal interconnect structures having one or more of the features described above, and IC structures incorporating such terminal interconnect structures, may be fabricated with a wide variety of techniques. FIG. 5 is a flow diagram illustrating methods 501 for forming gate interconnects, in accordance with some embodiments. Methods 501 may be practiced, for example, to fabricate the transistor structures 200 illustrated in FIGS. 2-3C.

In reference to FIG. 5, methods 501 begin with receiving a workpiece at block 505. In some embodiments, the workpiece received at block 505 includes a semiconductor wafer, such as a large format (e.g., 300-450 mm) silicon wafer. The workpiece may include one or more semiconductor device layers, for example. A device layer may further include one or more patterned semiconductor bodies. One or more dielectric materials may be adjacent to sidewalls of the semiconductor bodies. For example, any front end of line (FEOL) processing known to be suitable for the fabrication of a transistor may have been practiced upstream of methods 501. At block 520, one or more conductive gate interconnect materials are deposited, for example over a channel region of a semiconductor body. At block 525, a portion of the gate interconnect is masked with any suitable masking material. The mask may be lithographically patterned and/or etched to expose some portion of the gate interconnect materials. At block 530, the unmasked portion of the gate interconnect materials are recessed etched. In exemplary embodiments, an anisotropic etch process that is selective to one or more of the gate interconnect materials relative to adjacent dielectric materials is performed at block 530 to etch through a partial thickness of the gate interconnect. At block 535, the recesses in the gate interconnect are at least partially back-filled with one or more dielectric materials. A top surface of the dielectric material(s) deposited at block 535 may be planarized with a top surface of a non-recessed portion of the gate interconnect. For example, a chemical-mechanical polish (CMP) may remove excess dielectric (including any remnant of the mask formed at block 525) to expose a top surface of a portion of the gate interconnect. At block 545, an upper level interconnect is then fabricated to be coupled with the gate interconnect. For example, a dielectric material may be deposited over the planarized surface of the gate interconnect, and a trench or via formed in the dielectric to re-expose the gate interconnect. A conductive material may then be deposited within the trench or via to contact the gate interconnect. Methods 501 are then completed at block 550 where any back end of the line (BEOL) processes known to be suitable for the fabrication of an IC may be practiced.

Figure 6A:
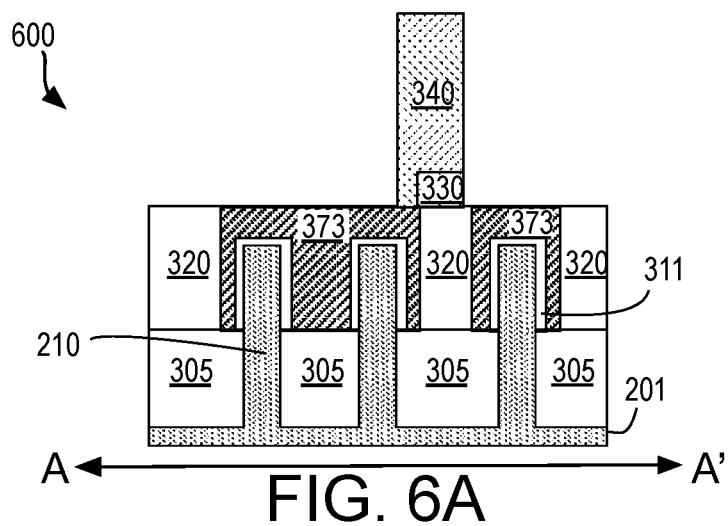
FIGS. 6A-6C, 7A-7C, and 8A-8C are cross-sectional views of a transistor and gate interconnects evolving as selected operations in the methods depicted in FIG. 5 are performed, in accordance with some embodiments.
Figure 6B:
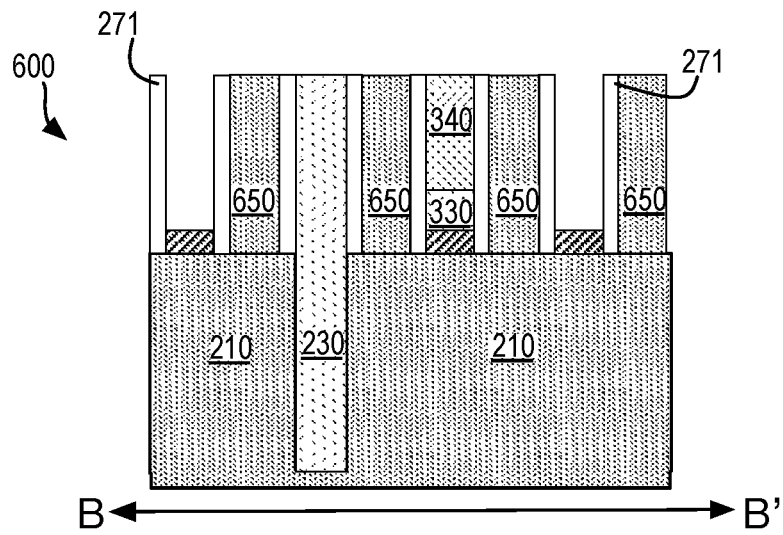
Figure 6C:
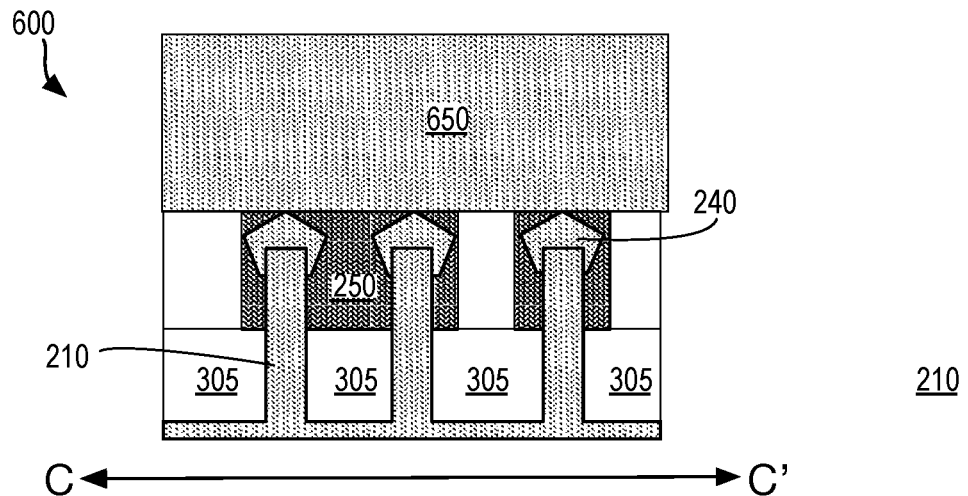
Figure 7A:
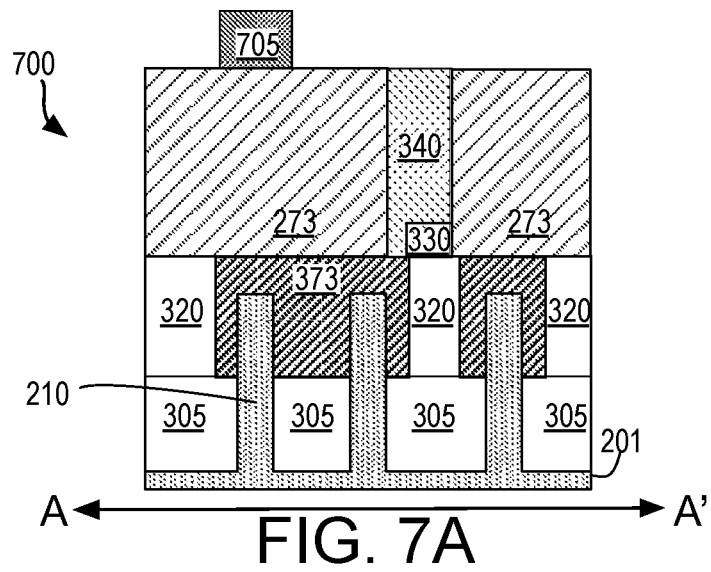
Figure 7B:
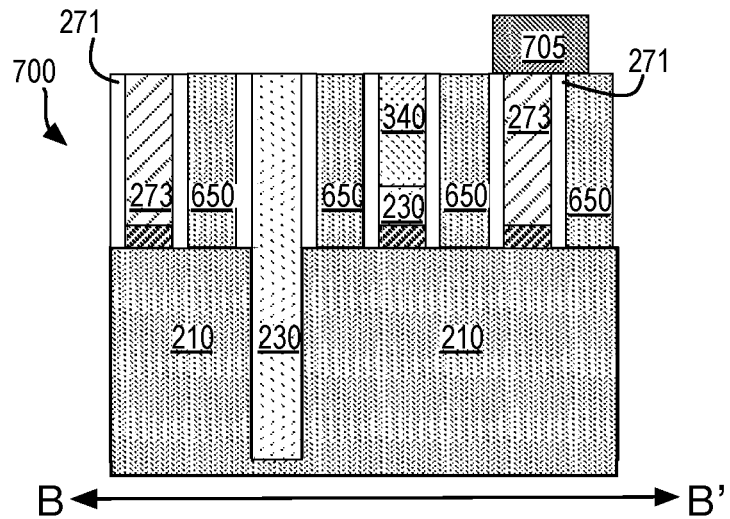
Figure 7C:
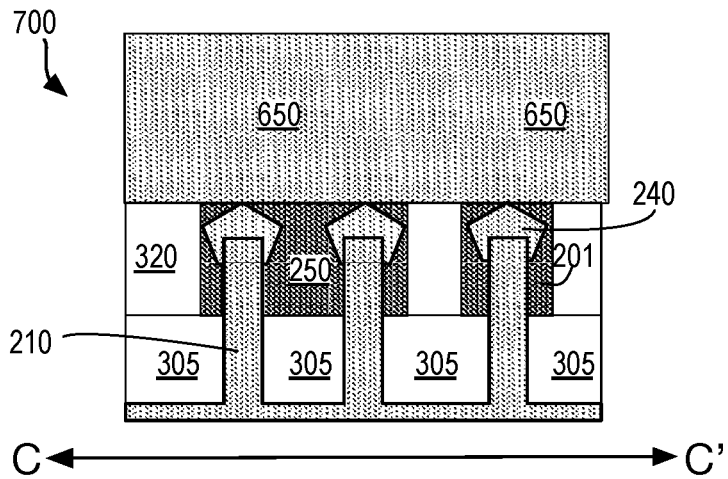
Figure 8A:
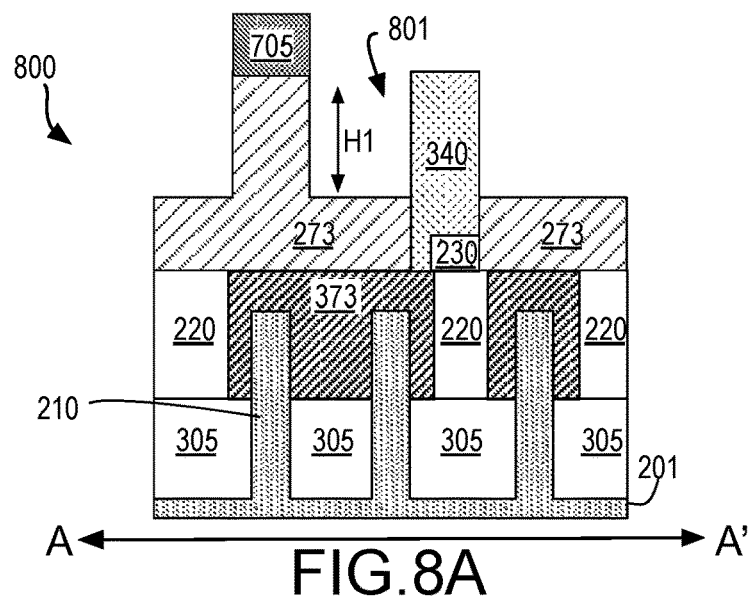
Figure 8B:
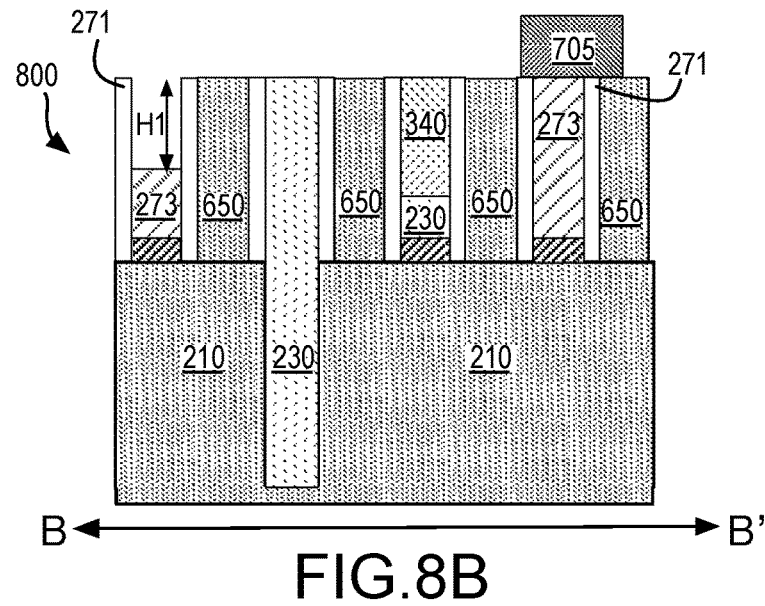
Figure 8C:
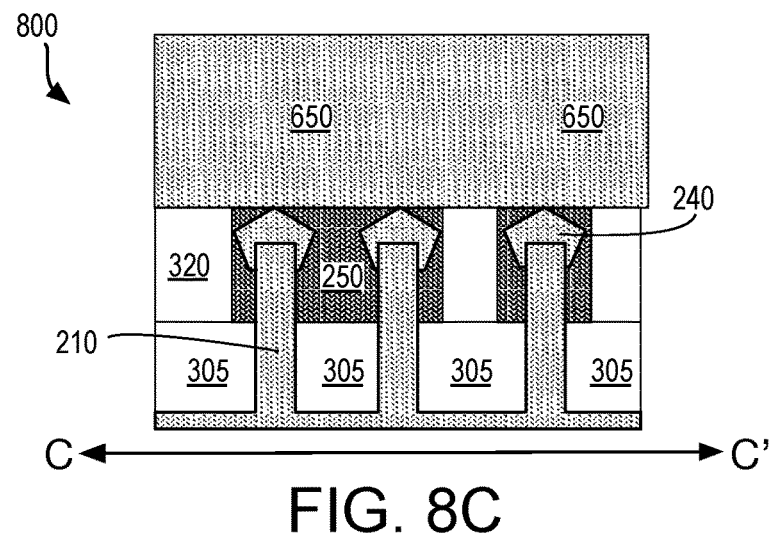

FIGS. 6A-6C, 7A-7C, and 8A-8C are cross-sectional views of a transistor and gate interconnects evolving as selected operations in the methods 501 are performed, in accordance with some embodiments. For clarity, the cross-sectional views shown in FIGS. 6A, 7A and 8A are along the A-A' line illustrated in FIG. 2, while the cross-sectional views shown in FIGS. 6B, 7B, and 8B are along the B-B' line illustrated in FIG. 2. Similarly, the cross-sectional views shown in FIGS. 6C, 7C, and 8C are along the C-C' line illustrated in FIG. 2.

As shown in FIG. 6A, a workpiece includes a transistor structure 600 that further includes a plurality of semiconductor bodies 210. Semiconductor bodies 210 may have been fabricated according to any techniques known to be suitable for finFETs, nanowire FETs, etc. Transistor structure 600 further includes conductive material 373 separated from semiconductor bodies 210 by one or more gate dielectric materials 311. Gate dielectric material 311 and conductive material 373 may have been formed, for example, according to any suitable gate replacement process. Subsequently, dielectric material 240 (and/or dielectric material 230) may be further patterned with any suitable process. As further shown in FIGS. 6B and 6C, a sacrificial material 650 is located in regions of transistor structure 600 where no gate interconnect is to be formed (e.g., where a source or drain interconnect is to be formed).

As further shown in FIG. 7A, transistor structure 700 includes structure 600 with the addition of conductive material 273 that has been deposited over conductive material 373. A top surface of conductive material 273 is planarized with dielectric material 240 to form discrete features of conductive material 273. A mask 705 comprising any suitable masking material (e.g., a hard mask dielectric or photosensitive material) has been formed over a portion of one or more features of conductive material 273. As shown in FIG. 7A and FIG. 7B, mask 705 may protect some portions of conductive material 273 while other portions of conductive material 273 remain unprotected.

As further shown in FIG. 8A, transistor structure 800 includes structure 700 following a recess etch of conductive material 273. The recess etch removes a partial thickness of conductive material equal to sidewall height H1. During the recess etch, a portion of conductive material 273 may be thinned with any etch process (e.g., dry plasma) known to be suitable for the composition of conductive material 273. Although illustrated to form substantially vertical sidewalls, it can be expected that the recess etch of conductive material 273 may positively slope the sidewalls from the edges of mask 705 and/or form a corner at the base of the etched sidewall that is rounded, for example substantially as described above in the context of FIG. 4A. As further illustrated in FIGS. 8A and 8B, while some portions of conductive material 273 are recessed by height H1, a top surface of other portions of conductive material 273 remain substantially planar with surrounding dielectric materials 271 and 340. The recess 801 may now be backfilled with a dielectric, which can then be planarized with a top surface of conductive material 273 in preparation for connecting to an upper level interconnect feature.

Figure 9:
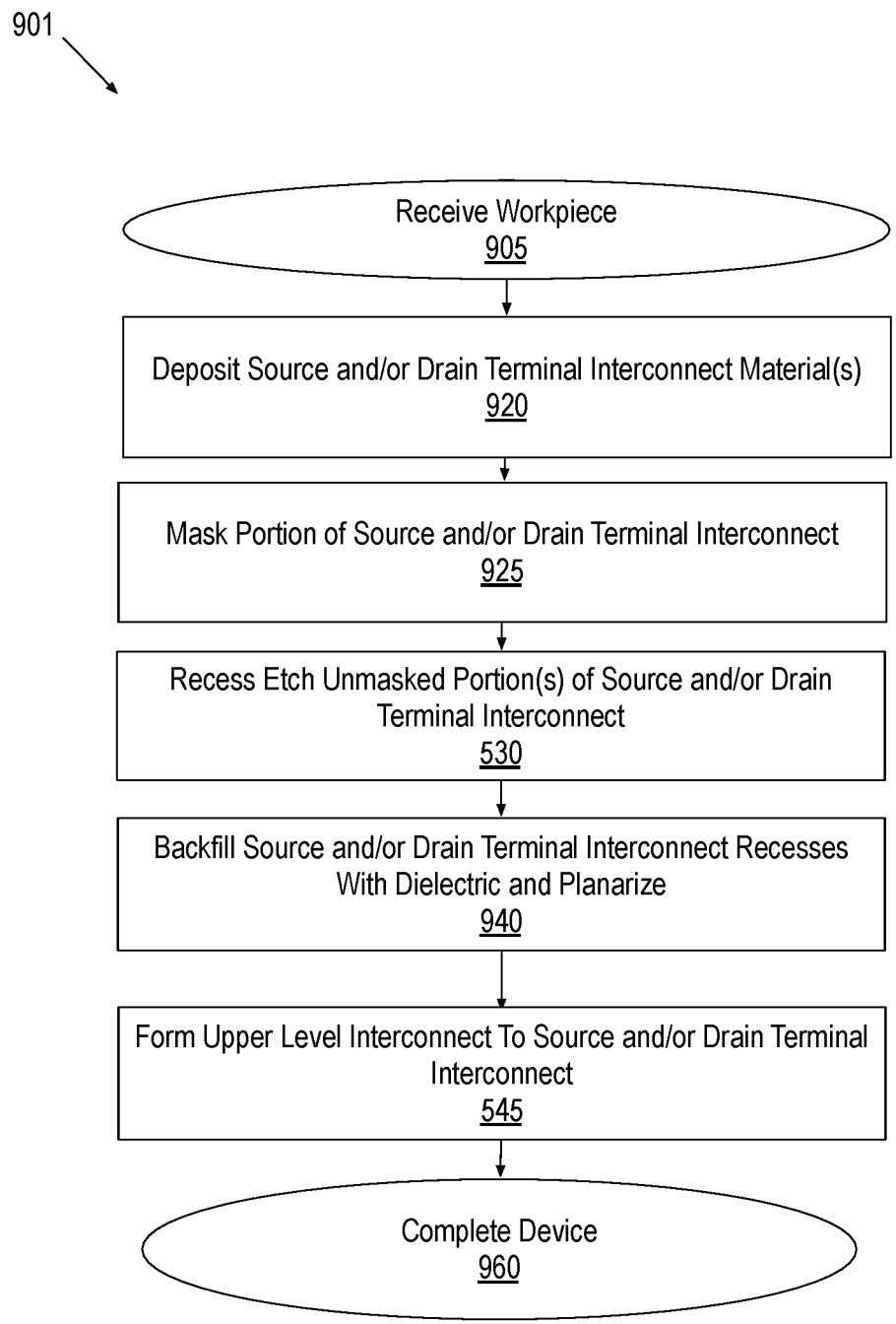
FIG. 9 is a flow diagram illustrating methods of forming source or drain interconnects, in accordance with some embodiments.

FIG. 9 is a flow diagram illustrating methods 901 for forming source or drain interconnects, in accordance with some embodiments. Methods 901 may be practiced, for example, in conjunction with methods 501 to fabricate the transistor structures 200 illustrated in FIGS. 2-3C that have gate interconnects and source or drain interconnects with pillar or ridge features. One or the other of methods 501 and 901 may also be practiced alone if a pillar or ridge feature is desired in only one type of device terminal interconnect.

In reference to FIG. 9, methods 901 begin with receiving a workpiece at block 905. In some embodiments, the workpiece received at block 905 includes a semiconductor wafer, such as a large format (e.g., 300-450 mm) silicon wafer. The workpiece may include one or more semiconductor device layers, for example. A device layer may further include one or more patterned semiconductor bodies. Any front end of line (FEOL) processing known to be suitable for the fabrication of a transistor may have been practiced upstream of methods 901.

In some embodiments, the methods 501 have been performed on a workpiece that is received at block 905.

At block 920, one or more conductive source or drain interconnect materials are deposited, for example over a source or drain semiconductor region of a semiconductor body. At block 925, a portion of the source or drain interconnect is masked with any suitable masking material. The mask may be lithographically patterned and/or partially etched to expose some portion of the gate interconnect materials. At block 930, the unmasked portion of the source or drain interconnect materials are recessed. In exemplary embodiments, an anisotropic etch process that is selective to one or more of the source or drain interconnect materials relative to adjacent dielectric materials is performed at block 930 to etch through a partial thickness of the source or drain interconnect. At block 935, the recesses in the source or drain interconnect are at least partially backfilled with one or more dielectric materials. A top surface of the dielectric material(s) deposited at block 935 may be planarized with a top surface of a non-recessed portion of the source or drain interconnect. For example, a chemical-mechanical polish (CMP) may remove excess dielectric (including any remnant of the mask formed at block 925) to expose a top surface of a portion of the source or drain interconnect. At block 945, an upper level interconnect is then fabricated to electrically couple with the source or drain interconnect. For example, a dielectric material may be deposited over the planarized surface of the source or drain interconnect, and a trench or via formed in the dielectric to re-expose the source or drain interconnect. A conductive material may then be deposited within the trench or via to contact the source or drain interconnect. Methods 901 are then completed at block 950 where any BEOL processes known to be suitable for the fabrication of an IC may be practiced.

FIGS. 10A-10C, 11A-11C, and 12A-12C, 13A-13C, 14A-14C, 15A-15C and 16A-16C are cross-sectional views of a transistor and source and/or drain interconnects evolving as selected operations in the methods 901 are performed, in accordance with some embodiments where a gate interconnect has already been fabricated according to methods 501. For clarity, the cross-sectional views shown in FIGS. 10A, 11A, 12A, 13A, 14A, 15A, and 16A are along the A-A' line illustrated in FIG. 2, while the cross-sectional views shown in FIGS. 10B, 11B, 12B, 13B, 14B, 15B, and 16B are along the B-B' line illustrated in FIG. 2. Similarly, the cross-sectional views shown in FIGS. 10C, 11C, 12C, 13C, 14C, 15C, and 16C are along the C-C' line illustrated in FIG. 2.

Figure 10A:
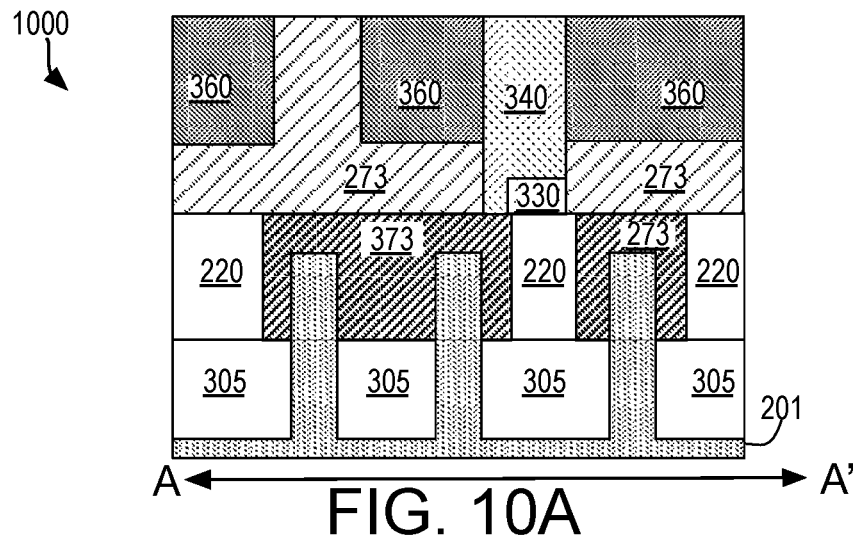
FIGS. 10A-10C, 11A-11C, and 12A-12C, 13A-13C, 14A-14C, 15A-15C and 16A-16C are cross-sectional views of a transistor and source or drain interconnects evolving as selected operations in the methods depicted in FIG. 9 are performed, in accordance with some embodiments.
Figure 10B:
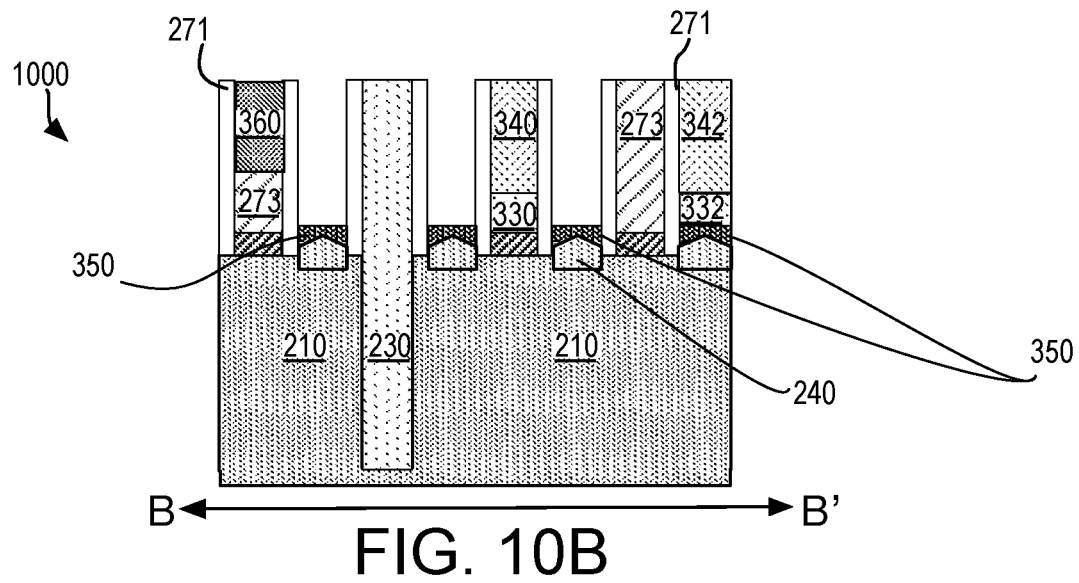
Figure 10C:
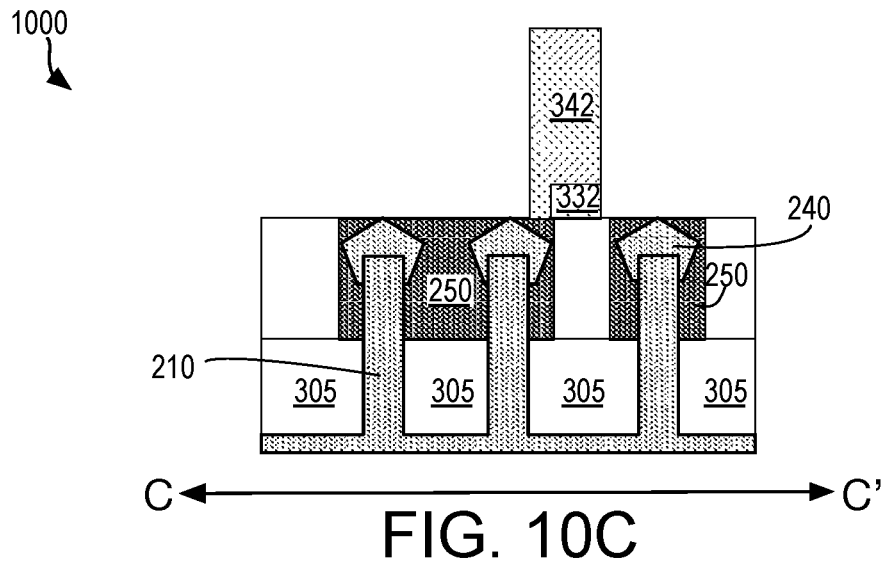
Figure 11A:
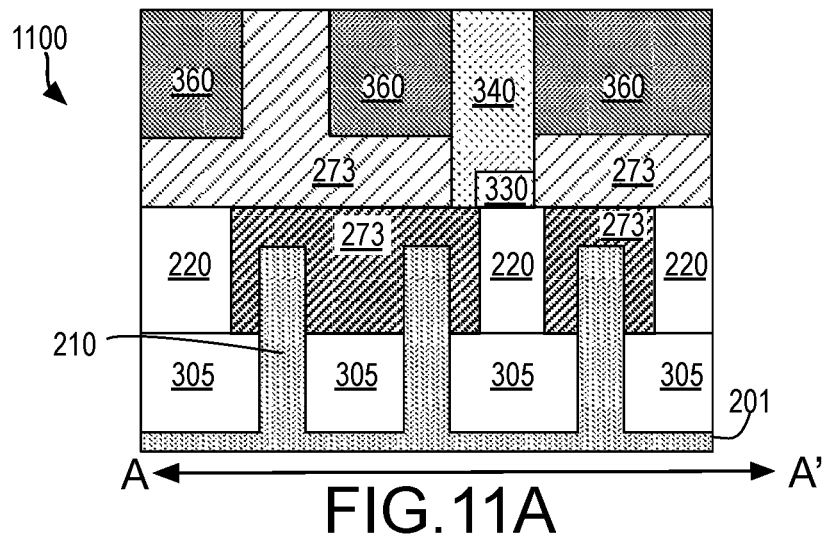
Figure 11B:
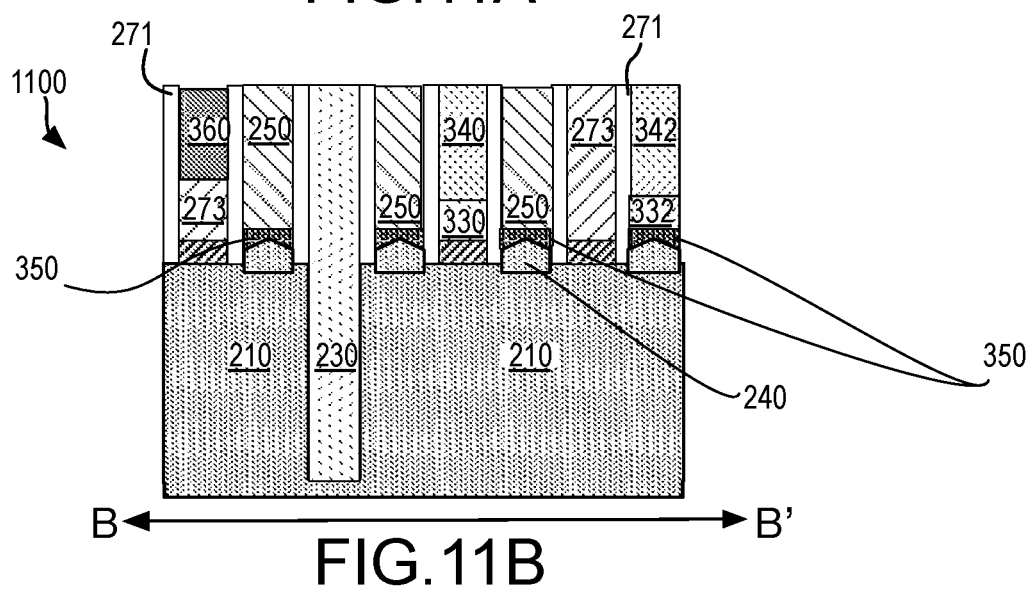
Figure 11C:
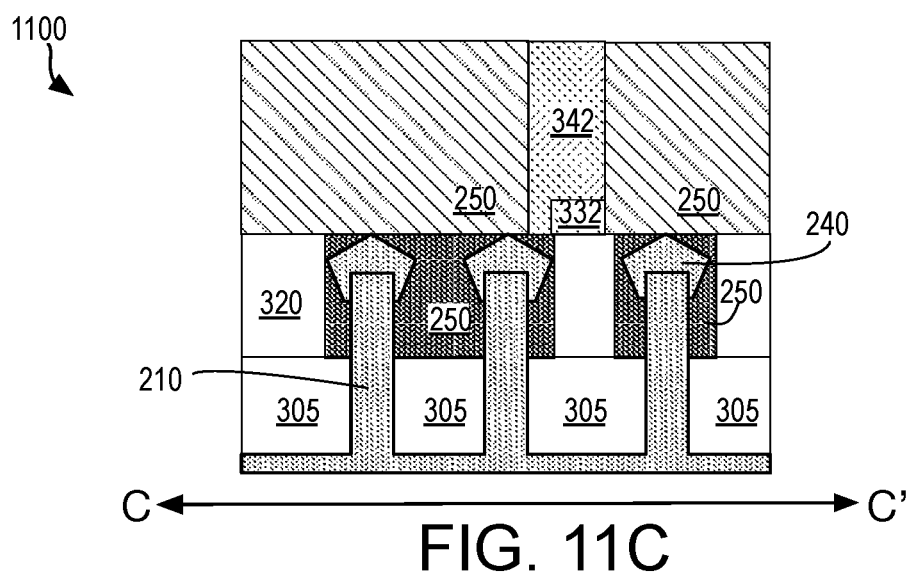

As shown in FIGS. 10A, 10B and 10C, a workpiece includes a transistor structure 1000 that further includes the transistor structure 800 (FIG. 8A-8C) following deposition of dielectric material 360 and the removal of mask 705. In preparation for source or drain interconnect formation, conductive material 350 has been formed on source or drain semiconductor 240. Additionally, one or more dielectric materials 232 and 242 have been deposited on conductive material 350, patterned, and planarized with a top surface of dielectric materials 271, 360. Dielectric material 232 may define breaks between features of conducive material 250, which is subsequently deposited to form transistor structure 1100 illustrated in FIG. 11A-11C. As shown in FIGS. 11B and 11C, overburden associated with the deposition of conductive material 250 has been planarized with a top surface of surrounding dielectric materials 271, 340, 342, and 260.

Figure 12A:
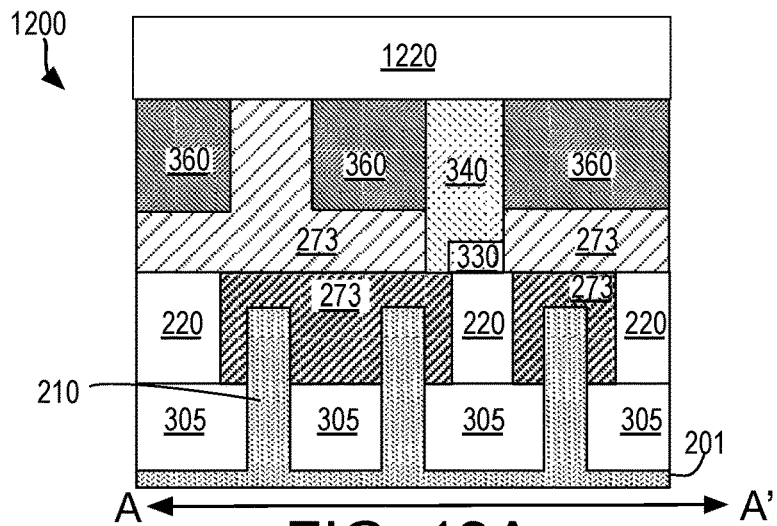
Figure 12B:
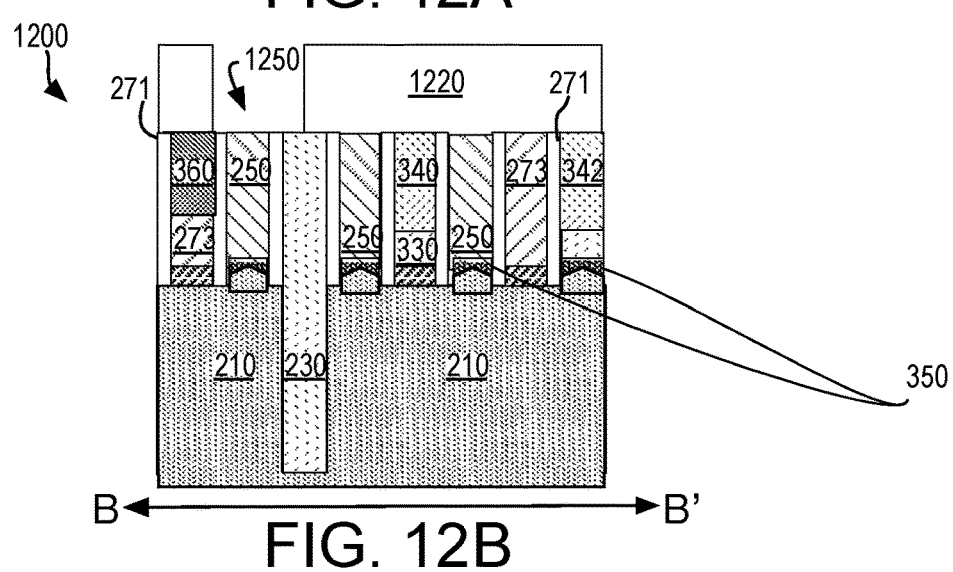
Figure 12C:
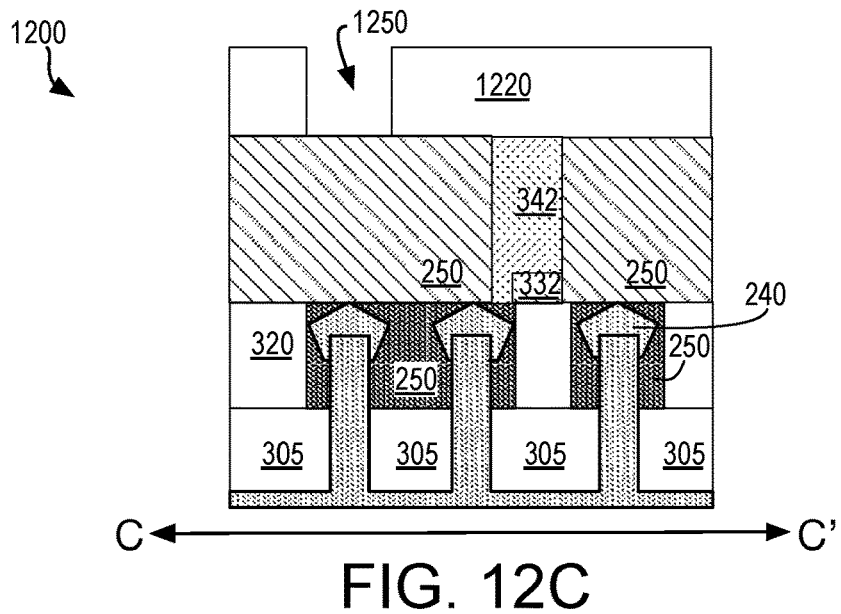
Figure 13A:
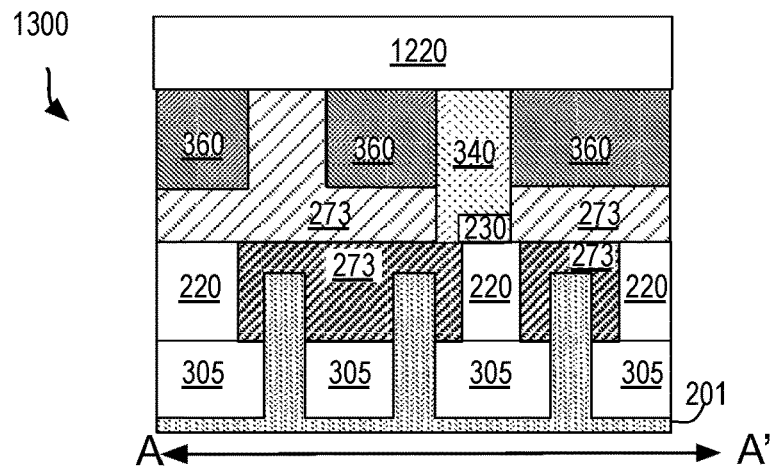
Figure 13B:
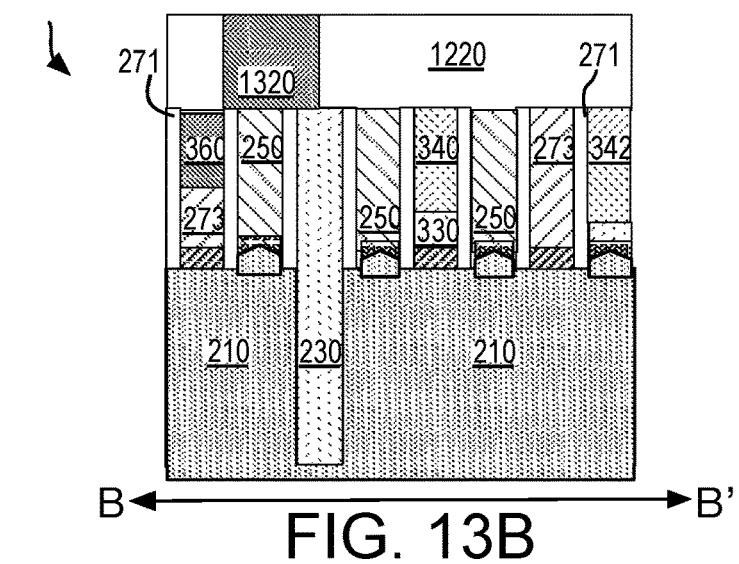
Figure 13C:
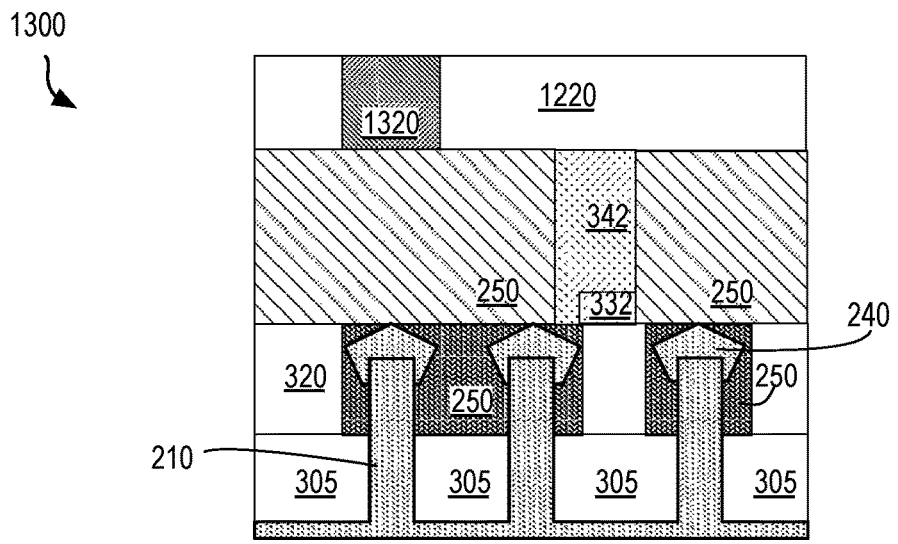
Figure 14A:
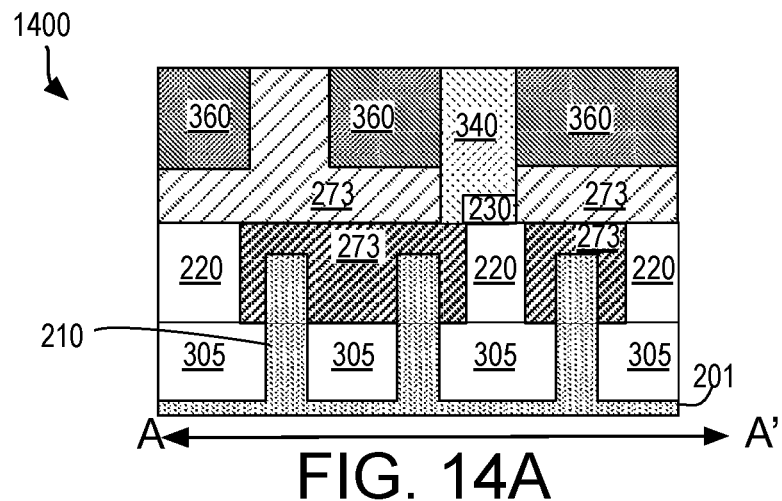
Figure 14B:
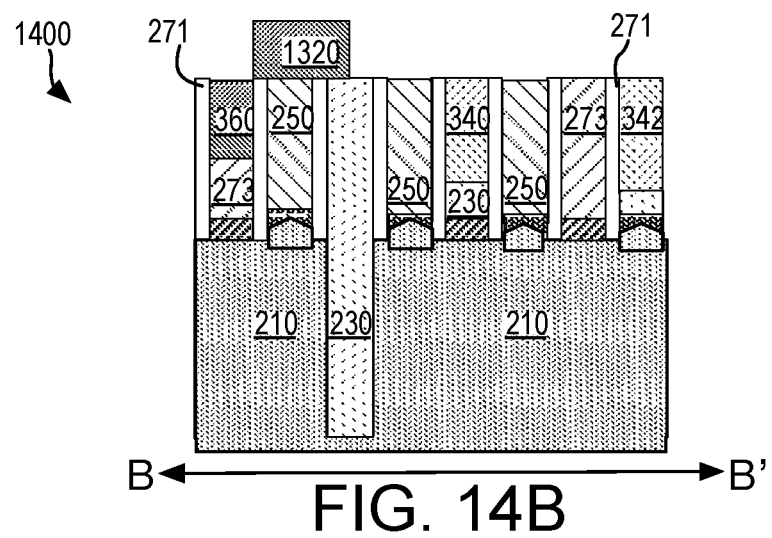
Figure 14C:
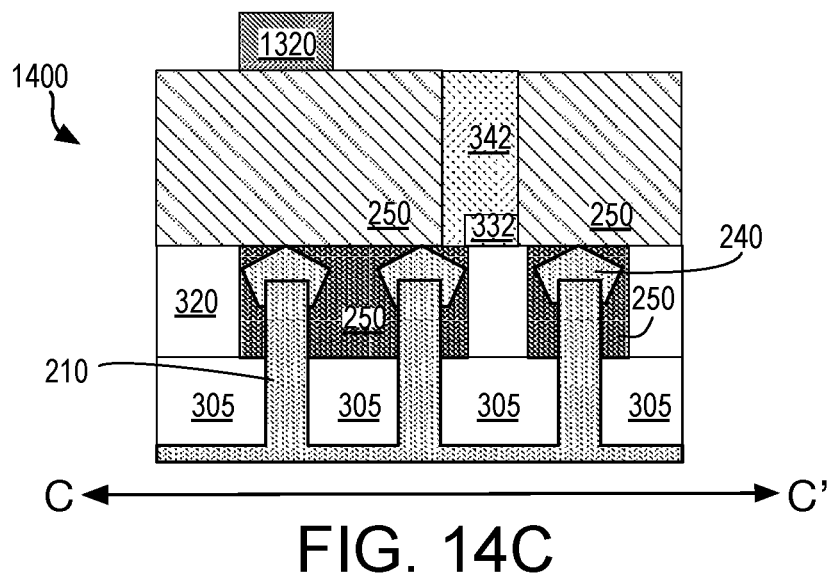
Figure 15A:
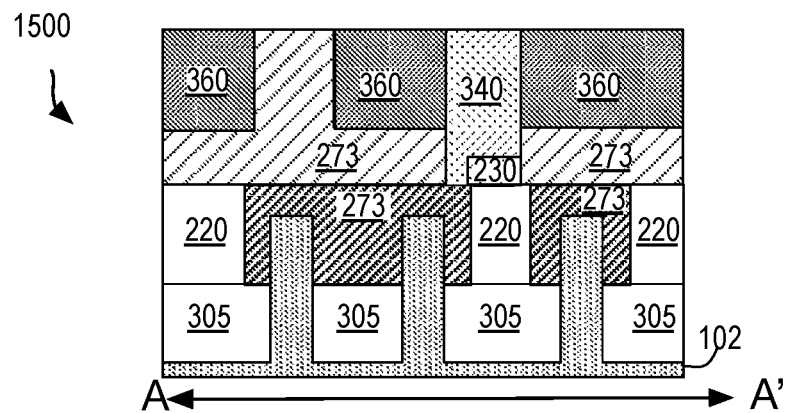
Figure 15B:
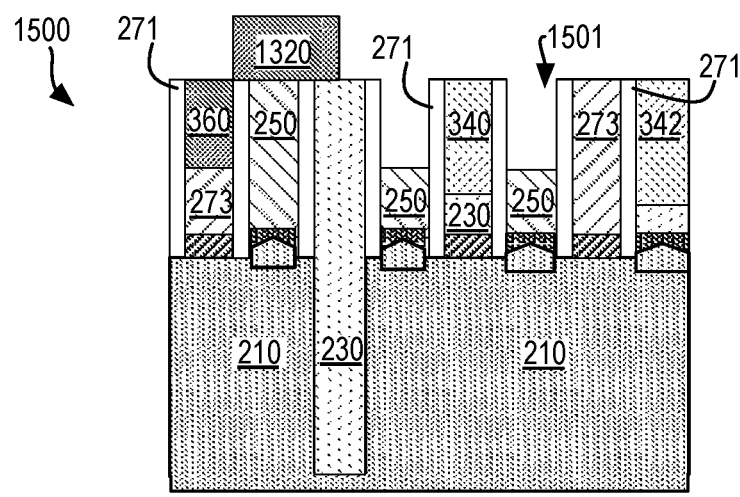
Figure 15C:
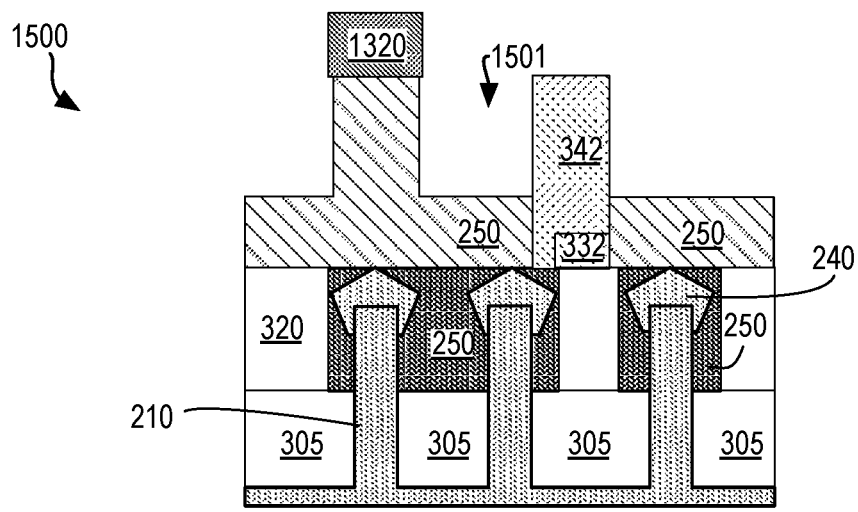
Figure 16A:
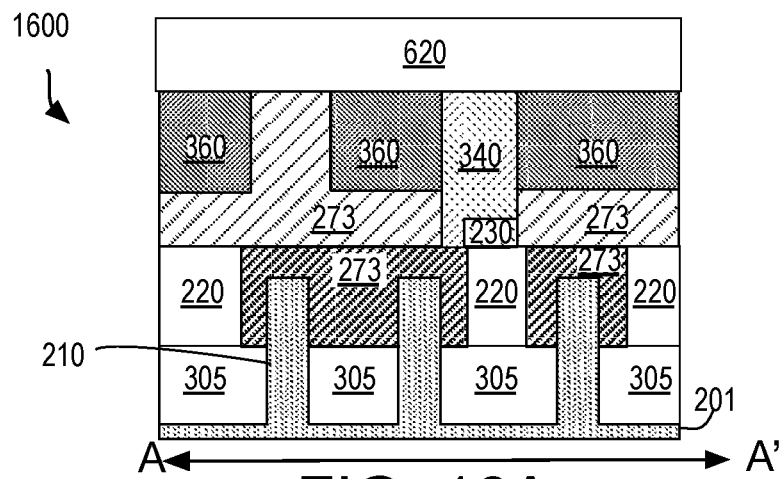
Figure 16B:
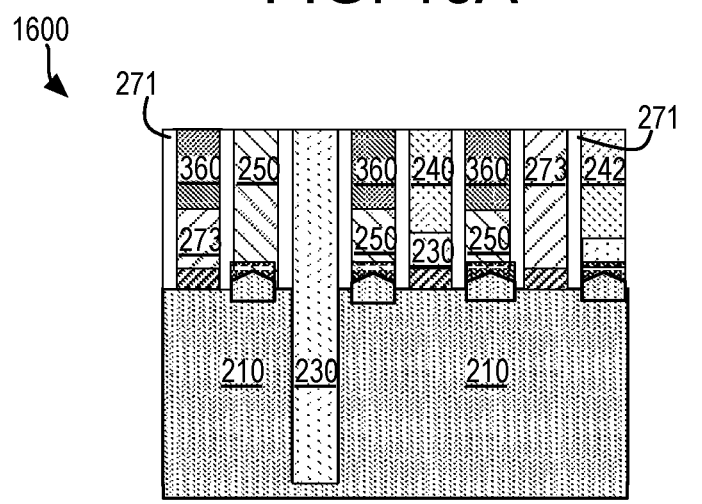
Figure 16C:
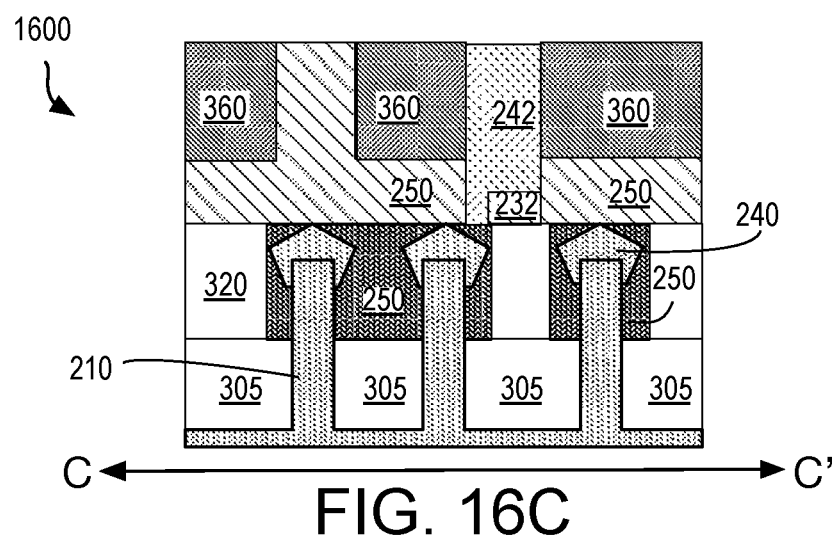

FIGS. 12A-12C, 13A-13C and 14A-14C further illustrate a pattern inversion process that may be employed to form a mask that protects only a portion of conductive material 250. In FIG. 12A-12C, transistor structure 1200 includes transistor structure 1100 and additionally includes a dark field mask 1220 that has an opening 1250 over a portion of conductive material 250. Mask 1220 may be similar to what might be employed to etch a via opening in a dielectric material, for example. Mask 1220 may be of any material known to be suitable as a mask, such as, but not limited to carbon-based materials (e.g., DLC or photoresist) or other dielectrics (e.g., SiO, SiN, etc.). Any patterning process known to be suitable for the mask material may be employed to form opening 1250. Transistor structure 1300 (FIG. 13A-13C) includes transistor structure 1200 with the addition of a mask material 1320 that has been deposited into mask opening 1250. A top surface of mask material 1320 may be planarized with a top surface of mask material 1220. Transistor structure 1400 (FIG. 14A-14C) includes transistor structure 1300 following the removal of mask material 1220 with a process that retains mask material 1320.

With mask 1320 in place, portions of conductive material 250 that are not protected by mask 1320 may be recess etched with any etch process known to be suitable for the composition of conductive material 250. In some embodiments, for example, an anisotropic plasma etch process is employed to form transistor structure 1500, illustrated in FIG. 15A-15C. As shown, recesses 1501 are formed where conductive material 250 has been recessed selectively to surrounding dielectric materials 271, 340, etc. and also relative to conductive material 273. Although illustrated to generate substantially vertical sidewalls, it can be expected that recess etching conductive material 273 will positively slope the sidewalls from the edges of mask 1320 and/or form a corner at the base of the etched sidewall that is rounded, for example substantially as described above in the context of FIG. 4B.

Recesses 1501 are then at least partially backfilled with dielectric material 360. Dielectric material 360 and/or mask 1350 may then be planarized (e.g., with CMP) with top surfaces of conductive material 250. Top surfaces of conductive material 250 may also be planarized with top surfaces of conductive material 273, and with top surfaces of surrounding dielectric material(s) to arrive at transistor structure 1600, illustrated in FIG. 16A-16C. One or more additional dielectric material layers may be deposited over transistor structure 1600, and one or more interconnect via or line fabricated to contact a top surface of one or more of conductive materials 250 and 273.

Figure 17:
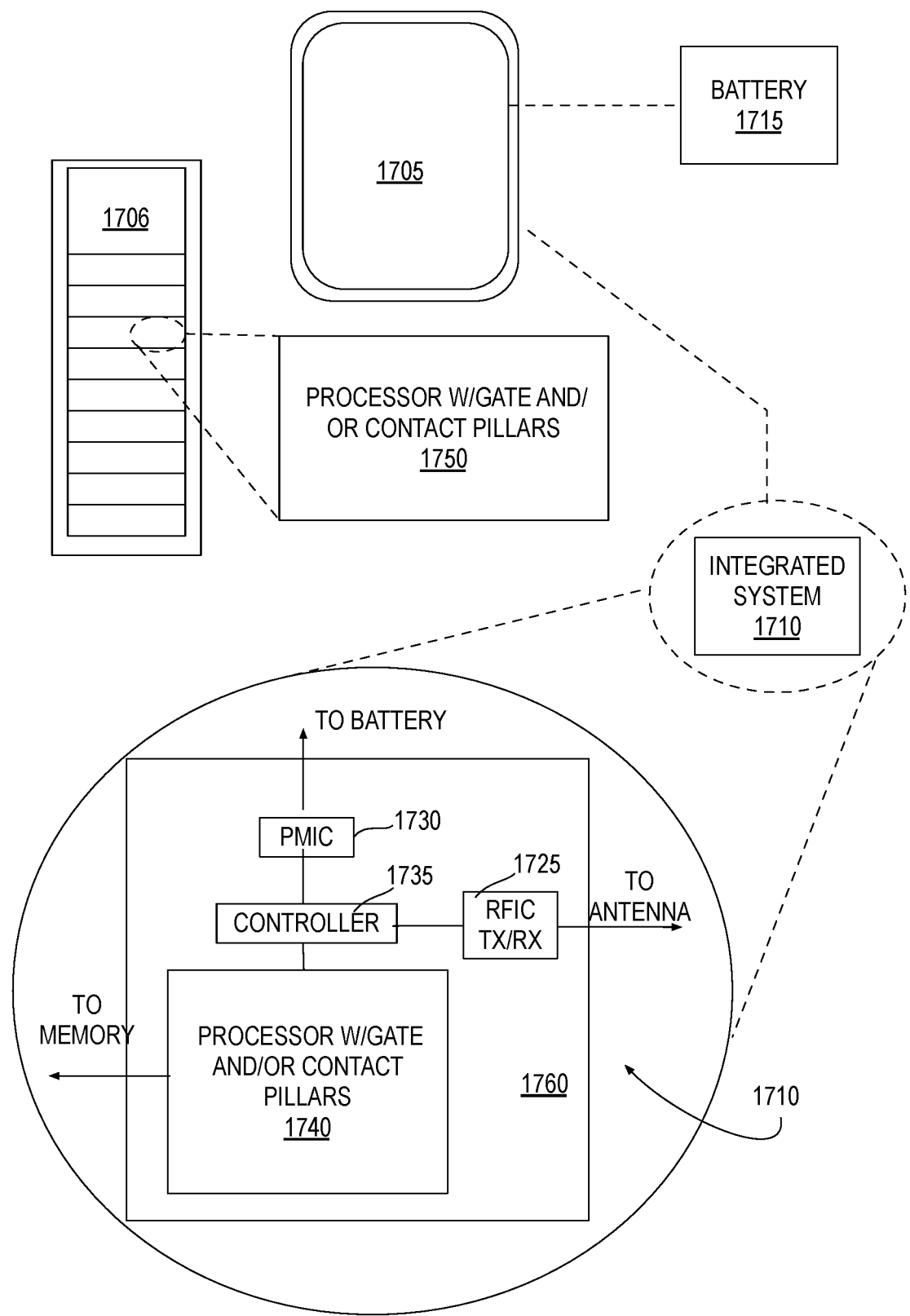
FIG. 17 illustrates a mobile computing platform and a data server machine employing an IC structure including a device terminal pillar structure, in accordance with embodiments of the present invention.

FIG. 17 illustrates a system 1700 in which a mobile computing platform 1705 and/or a data server machine 1706 employs an IC structure including a transistor terminal interconnect structure in accordance with one or more embodiment of the present invention. The server machine 1706 may be any commercial server, for example including any number of high-performance computing platforms disposed within a rack and networked together for electronic data processing, which in the exemplary embodiment includes a packaged monolithic IC 1750. The mobile computing platform 1705 may be any portable device configured for each of electronic data display, electronic data processing, wireless electronic data transmission, or the like. For example, the mobile computing platform 1705 may be any of a tablet, a smart phone, laptop computer, etc., and may include a display screen (e.g., a capacitive, inductive, resistive, or optical touchscreen), a chip-level or package-level integrated system 1710, and a battery 1715.

Whether disposed within the integrated system 1710 illustrated in the expanded view 1720, or as a stand-alone packaged chip within the server machine 1706, packaged monolithic IC 1750 includes a memory chip (e.g., RAM), or a processor chip (e.g., a microprocessor, a multi-core microprocessor, graphics processor, or the like) employing a transistor terminal interconnect, for example having one or more of the features described elsewhere herein. The monolithic IC 1750 may be further coupled to a board, a substrate, or integrated into a system-on-chip (SOC) 1760 along with, one or more of a power management integrated circuit (PMIC) 1730, RF (wireless) integrated circuit (RFIC) 1725 including a wideband RF (wireless) transmitter and/or receiver (TX/RX) (e.g., including a digital baseband and an analog front end module further comprises a power amplifier on a transmit path and a low noise amplifier on a receive path), and a controller thereof 1735.

Functionally, PMIC 1730 may perform battery power regulation, DC-to-DC conversion, etc., and so has an input coupled to battery 1715 and with an output providing a current supply coupled to other functional modules. As further illustrated, in the exemplary embodiment, RFIC 1725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1750 or within a single IC coupled to the package substrate of the monolithic IC 1750. In particular embodiments, at least one of a processor IC, memory IC, RFIC, or PMIC includes logic circuitry that incorporates a pillar resistor, and/or a transistor and pillar resistor structure, having one or more of the structural features described elsewhere herein.

Figure 18:
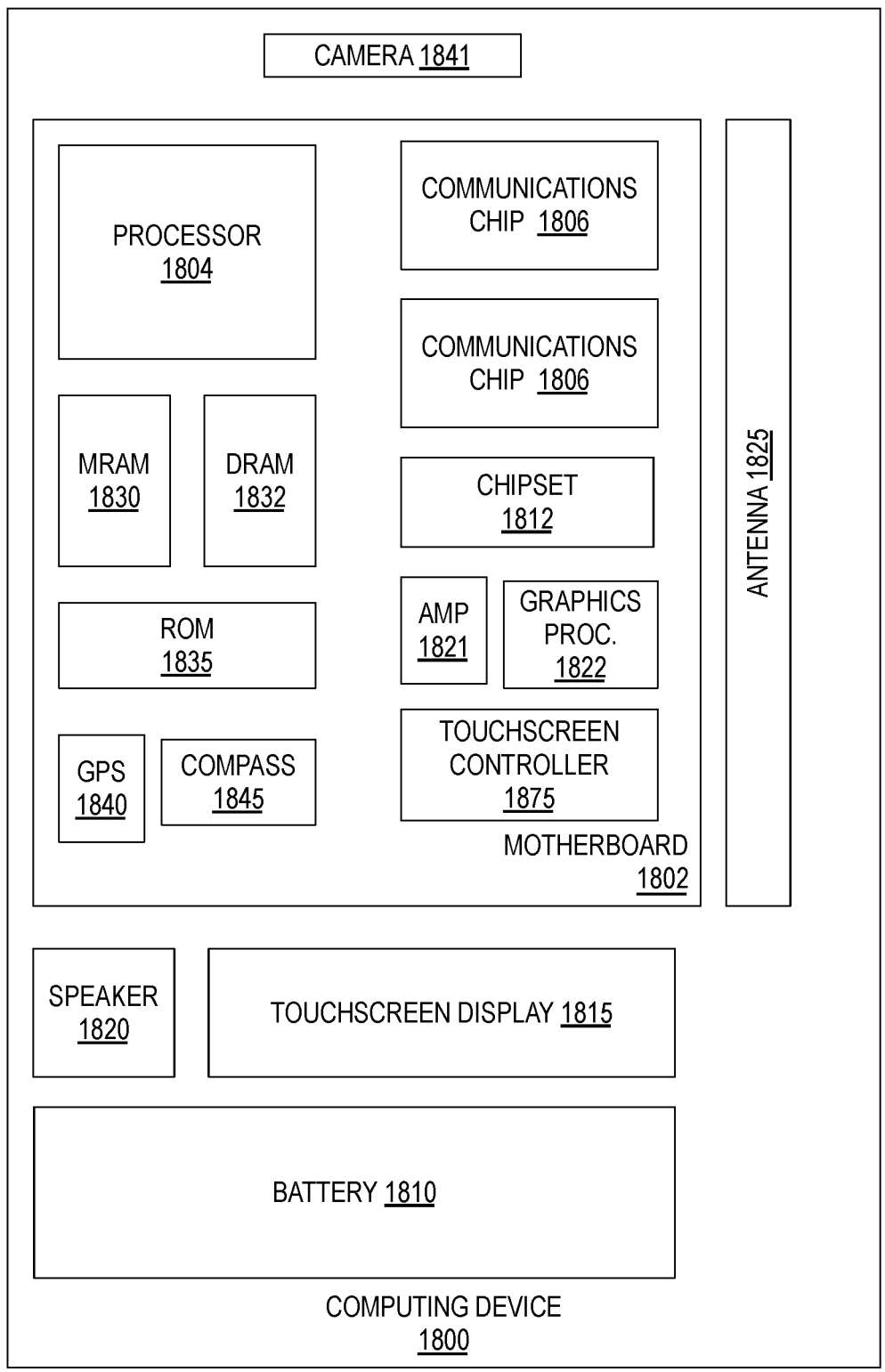
FIG. 18 is a functional block diagram of an electronic computing device, in accordance with an embodiment of the present invention.

FIG. 18 is a functional block diagram of a computing device 1800, arranged in accordance with at least some implementations of the present disclosure. Computing device 1800 may be found inside platform 1705 or server machine 1706, for example. Device 1800 further includes a motherboard 1802 hosting a number of components, such as, but not limited to, a processor 1804 (e.g., an applications processor), which may further incorporate a transistor terminal interconnect, for example having one or more of the features described elsewhere herein. Processor 1804 may be physically and/or electrically coupled to motherboard 1802. In some examples, processor 1804 includes an integrated circuit die packaged within the processor 1804. In general, the term "processor" or "microprocessor" may refer to any device or portion of a device that processes electronic data from registers and/or memory to transform that electronic data into other electronic data that may be further stored in registers and/or memory.

In various examples, one or more communication chips 1806 may also be physically and/or electrically coupled to the motherboard 1802. In further implementations, communication chips 1806 may be part of processor 1804. Depending on its applications, computing device 1800 may include other components that may or may not be physically and electrically coupled to motherboard 1802. These other components include, but are not limited to, volatile memory (e.g., MRAM 1830, DRAM 1832), non-volatile memory (e.g., ROM 1835), flash memory, a graphics processor 1822, a digital signal processor, a crypto processor, a chipset, an antenna 1825, touchscreen display 1815, touchscreen controller 1875, battery 1810, audio codec, video codec, power amplifier 1821, global positioning system (GPS) device 1840, compass 1845, accelerometer, gyroscope, audio speaker 1820, camera 1841, and mass storage device (such as hard disk drive, solid-state drive (SSD), compact disk (CD), digital versatile disk (DVD), and so forth), or the like.

Communication chips 1806 may enable wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1806 may implement any of a number of wireless standards or protocols, including but not limited to those described elsewhere herein. As discussed, computing device 1800 may include a plurality of communication chips 1806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
   a transistor structure;
   a first interconnect feature electrically coupled to the transistor structure, wherein:
   the first interconnect feature is over the transistor structure;
   a first portion of the first interconnect feature has a first thickness; and
   a second portion of the first interconnect feature has a second thickness, less than the first thickness;
   a dielectric material adjacent to a sidewall of the first portion of the first interconnect feature, and over the second portion of the first interconnect feature; and
   a second interconnect feature in contact with the first portion of the first interconnect feature.

2. The IC structure of claim 1, wherein:
   a bottom surface of the first interconnect feature contacts the transistor structure within a first plane through the transistor structure;
   a top surface of the first portion is above the first plane by the first thickness; and
   a top surface of the second portion is above the first plane by the second thickness.

3. The IC structure of claim 1, wherein the second interconnect feature has a different composition than the first portion of the first interconnect feature.

4. The IC structure of claim 1, wherein the first portion of the first interconnect feature has a first lateral width proximal to the second interconnect feature that is smaller than a second lateral width of the first interconnect feature proximal to the transistor structure.

5. The IC structure of claim 1, wherein the sidewall of the first portion of the first interconnect feature has a positive radius of curvature about a point located within the dielectric material adjacent to the sidewall of the first portion of the first interconnect feature.

6. The IC structure of claim 1, wherein the first interconnect feature is a gate interconnect that is in direct contact with a gate electrode of the transistor structure.

7. The IC structure of claim 1, wherein the first interconnect feature is a source or drain interconnect that is in direct contact with a semiconductor material.

8. The IC structure of claim 1, wherein:
   the transistor structure comprises one or more semiconductor bodies;
   the first portion of the first interconnect feature has the first thickness over a top surface of at least one of the semiconductor bodies; and
   the second portion of the first interconnect feature has the second thickness relative to the top surface.

9. An integrated circuit (IC) structure, comprising:
   a transistor structure comprising a gate, a source semiconductor material, and a drain semiconductor material;
   a gate interconnect feature electrically coupled to the gate, wherein:
   a first portion of the gate interconnect feature has a first thickness over a first plane passing through the gate; and
   a second portion of the gate interconnect feature has a second thickness relative to the first plane, wherein the second thickness is less than the first thickness;
   one or more dielectric materials adjacent to the first portion of the gate interconnect feature, and over the second portion of the gate interconnect feature; and
   a first upper level interconnect feature in contact with the first portion of the gate interconnect feature.

10. The IC structure of claim 9, further comprising a source interconnect feature electrically coupled to the source semiconductor material, wherein:
    a first portion of the source interconnect feature has a third thickness over a second plane passing through the source semiconductor material; and
    a second portion of the source interconnect feature has a fourth thickness relative to the second plane, wherein the fourth thickness is less than the third thickness.

11. The IC structure of claim 10, further comprising a second upper level interconnect feature in contact with a surface of the first portion of the source interconnect feature.

12. The IC structure of claim 10, further comprising a drain interconnect feature electrically coupled to the drain semiconductor material, wherein:
    a first portion of the drain interconnect feature has a fifth thickness over a third plane passing through the drain semiconductor material; and
    a second portion of the drain interconnect feature has a sixth thickness relative to the third plane, wherein the fifth thickness is less than the sixth thickness.

13. The IC structure of claim 12, further comprising a second upper level interconnect feature in contact with a surface of the first portion of the drain interconnect feature.

14. The IC structure of claim 12, wherein gate interconnect feature has a different composition than the source interconnect feature and drain interconnect feature.

15. A method of fabricating an integrated circuit (IC) structure, the method comprising:
   forming a first interconnect feature over a transistor structure;
   masking a first portion of the first interconnect feature;
   recessing an unmasked second portion of the first interconnect feature;
   backfilling one or more recesses in the first interconnect feature with a dielectric material;
   planarizing the first portion of the first interconnect feature with the dielectric material; and
   forming an upper level interconnect feature in contact with the first portion of the first interconnect feature and over the dielectric material.

16. The method of claim 15, wherein:
   forming the first interconnect feature comprises anisotropically etching a second dielectric material adjacent to a sidewall of the first interconnect feature; and
   the backfilling of the one or more recesses in the first interconnect feature comprises depositing the dielectric material adjacent to a sidewall of the second dielectric material.

17. The method of claim 16, wherein forming the first interconnect feature further comprises:
   depositing a first material over the transistor structure;
   planarizing a surface of the first material with a surface of a first dielectric material that is adjacent to a sidewall of the first material;
   depositing a second dielectric material over the first material and over the first dielectric material;
   patterning the second dielectric material to expose at least a portion of the first material;
   depositing a second material onto an exposed portion of the first material; and
   planarizing the second material with the second dielectric material.

18. The method of claim 17, wherein recessing the unmasked second portion of the first interconnect feature further comprises recessing the second material without exposing the first material.

19. The method of claim 17, wherein the first material is in contact with the transistor structure.

20. The method of claim 15, further comprising:
   forming a second interconnect feature over the transistor structure;
   masking a first portion of the second interconnect feature;
   recessing an unmasked second portion of the second interconnect feature;
   backfilling one or more recesses in the second interconnect feature with a second dielectric material;
   planarizing the first portion of the second interconnect feature with the second dielectric material; and
   forming a second upper level interconnect feature in contact with the first portion of the second interconnect feature and over the dielectric material.

* * * * *